US008728720B2

(12) United States Patent
Hwang et al.

(10) Patent No.: US 8,728,720 B2
(45) Date of Patent: May 20, 2014

(54) ARBITRARY PATTERN DIRECT NANOSTRUCTURE FABRICATION METHODS AND SYSTEM

(75) Inventors: David Jen Hwang, Albany, CA (US); Costas P. Grigoropoulos, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 286 days.

(21) Appl. No.: 13/156,221

(22) Filed: Jun. 8, 2011

(65) Prior Publication Data

US 2011/0318695 A1    Dec. 29, 2011

Related U.S. Application Data

(60) Provisional application No. 61/352,694, filed on Jun. 8, 2010.

(51) Int. Cl.
    *G03F 7/00*    (2006.01)
(52) U.S. Cl.
    USPC .......................................... 430/322; 430/320
(58) Field of Classification Search
    USPC ................... 430/5, 320, 322; 359/651, 811
    See application file for complete search history.

(56) References Cited

U.S. PATENT DOCUMENTS

| | | | |
|---|---|---|---|
| 6,344,272 B1 | 2/2002 | Oldenburg et al. | |
| 6,379,867 B1 * | 4/2002 | Mei et al. | 430/296 |
| 6,530,944 B2 | 3/2003 | West et al. | |
| 6,955,639 B2 | 10/2005 | Hainfeld et al. | |
| 7,419,887 B1 | 9/2008 | Quick et al. | |
| 7,741,006 B2 | 6/2010 | Yang et al. | |
| 7,834,331 B2 | 11/2010 | Ben-Yakar et al. | |
| 7,998,661 B2 | 8/2011 | Kim et al. | |
| 2004/0079195 A1 * | 4/2004 | Perry et al. | 75/345 |
| 2007/0019306 A1 * | 1/2007 | Wu et al. | 359/811 |
| 2008/0298542 A1 * | 12/2008 | Ivanova | 378/34 |

OTHER PUBLICATIONS

Marcinkevicius, et al. Femtosecond laser-assisted three-dimensional microfabrication in silica. Optics Letters, vol. 26, pp. 277-279, Jun. 15, 2003.
Taylor, et al. Femtosecond laser fabrication of nanostructures in silica glass. Optics Letters, vol. 28, pp. 1043-1045, Mar. 1, 2001.

* cited by examiner

*Primary Examiner* — Stewart Fraser
(74) *Attorney, Agent, or Firm* — Bozicevic, Field & Francis LLP; Bret E. Field; Rudy J. Ng

(57) ABSTRACT

Methods of producing a nanostructure in a target film are provided. The method includes selectively irradiating at least one focusing element of a near-field focusing array that is in near-field focusing relationship with a target film in a manner sufficient to produce a nanostructure from the target film. Also provided are systems for practicing methods of the invention, as well as objects produced thereby.

21 Claims, 26 Drawing Sheets

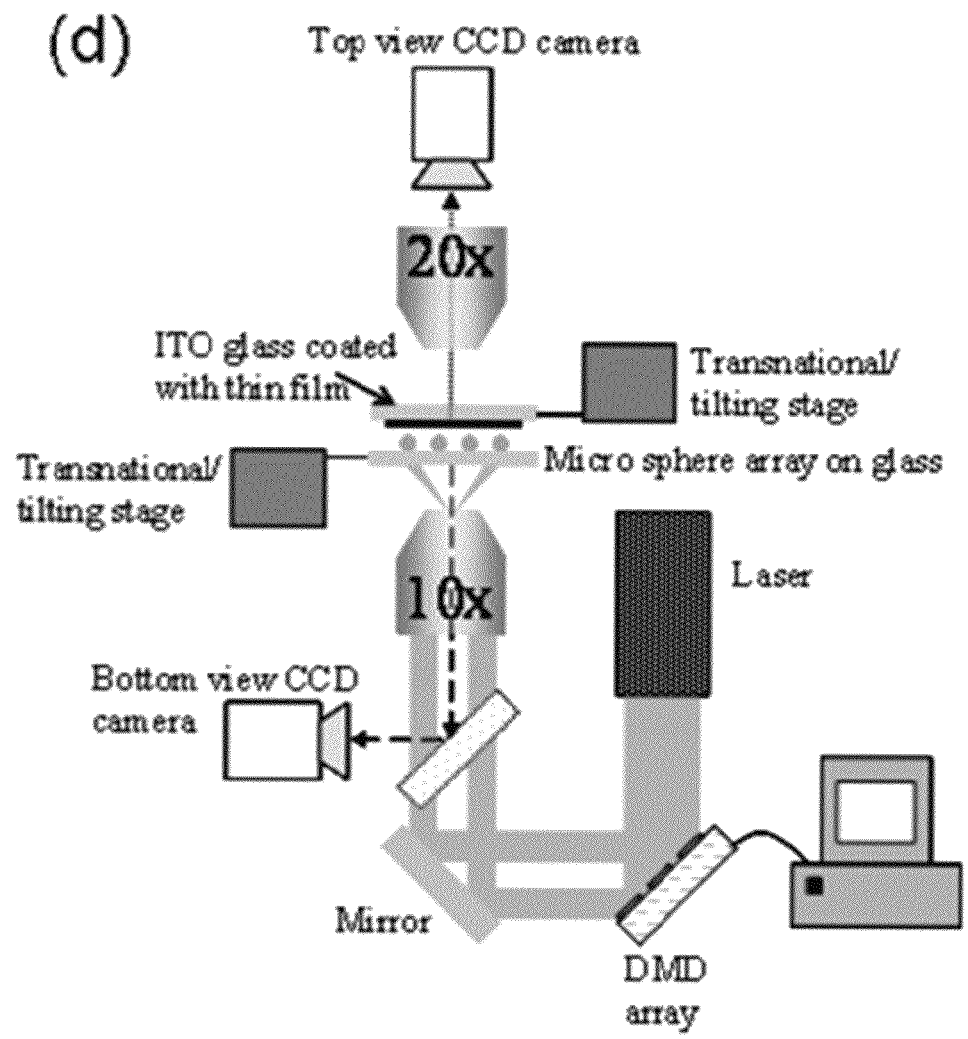
FIG. 1, cont'd

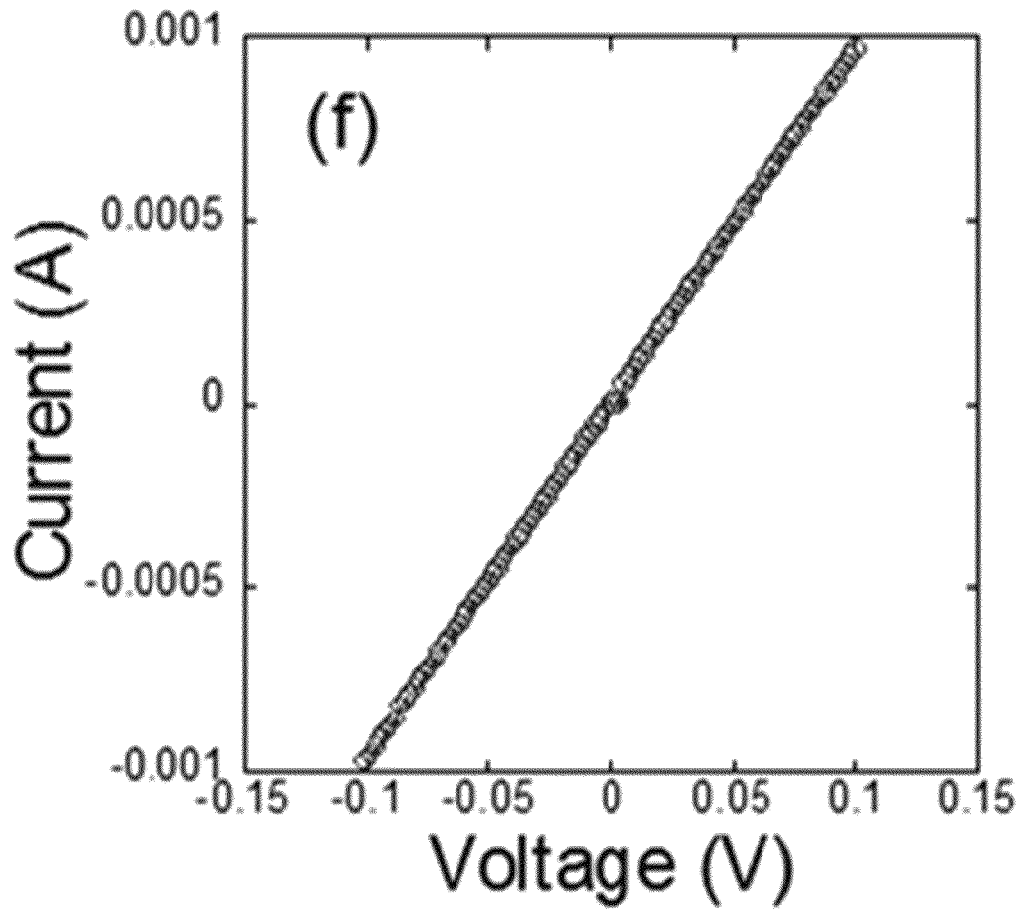
FIG. 7, cont'd

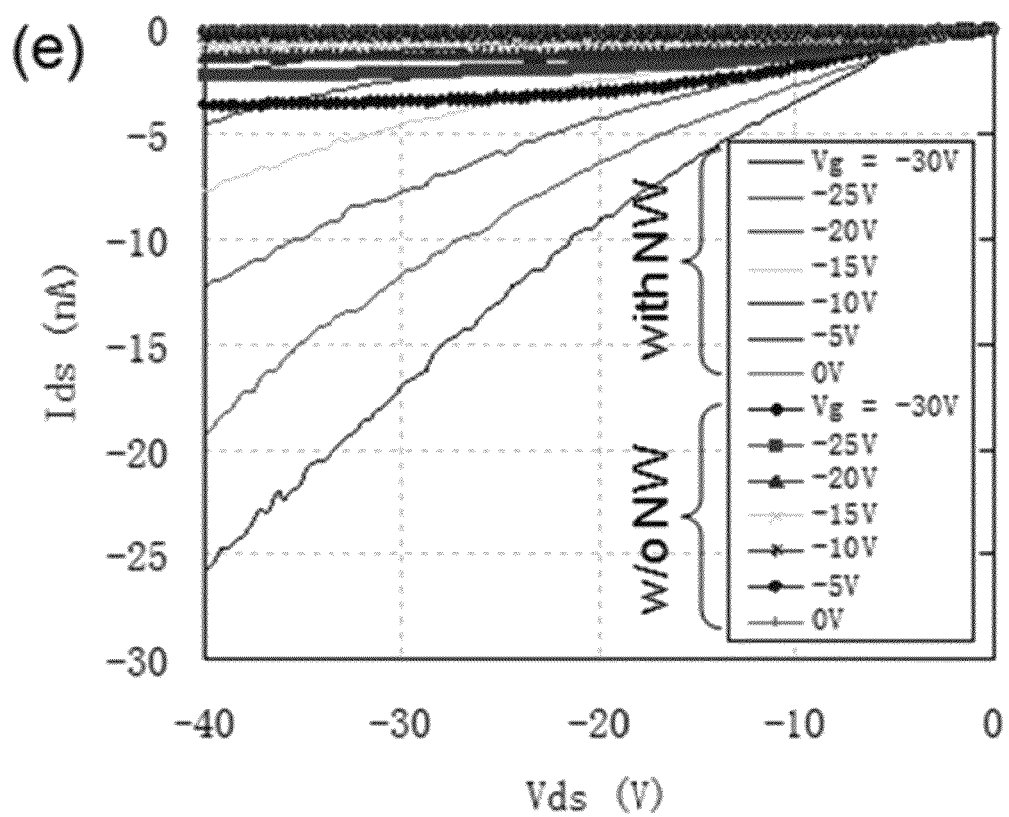
FIG. 8, cont'd

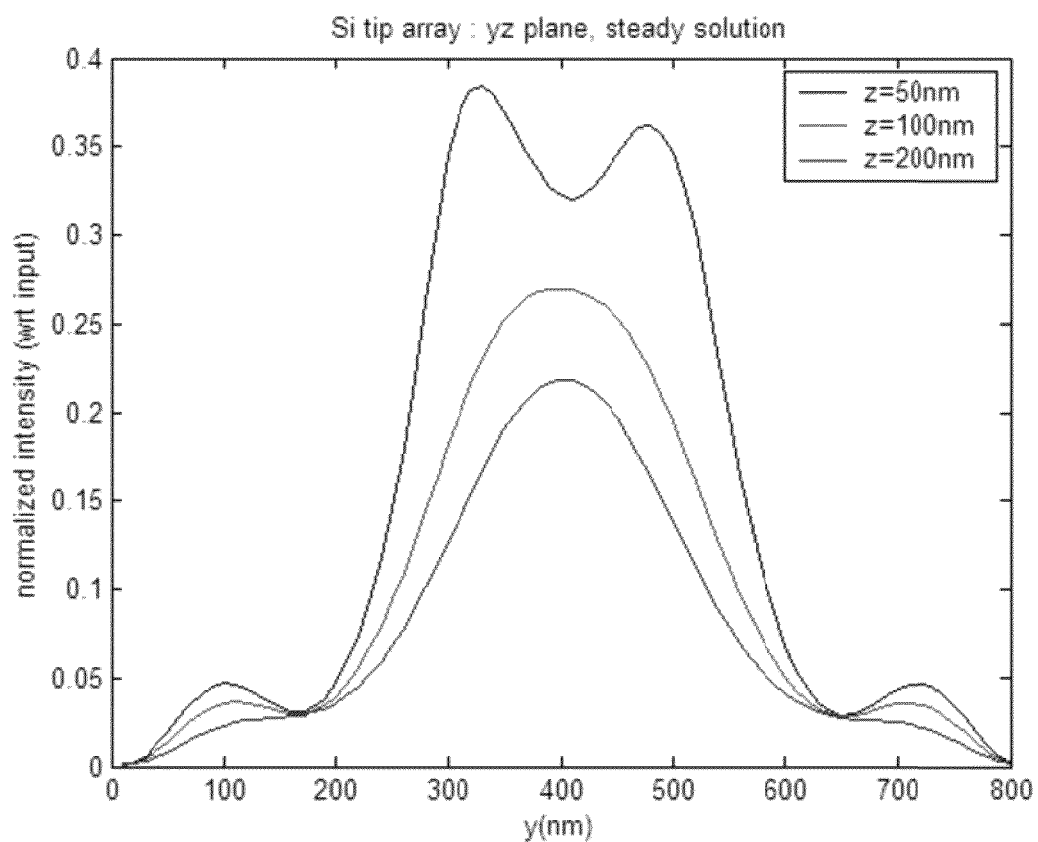
FIG. 10B, cont'd

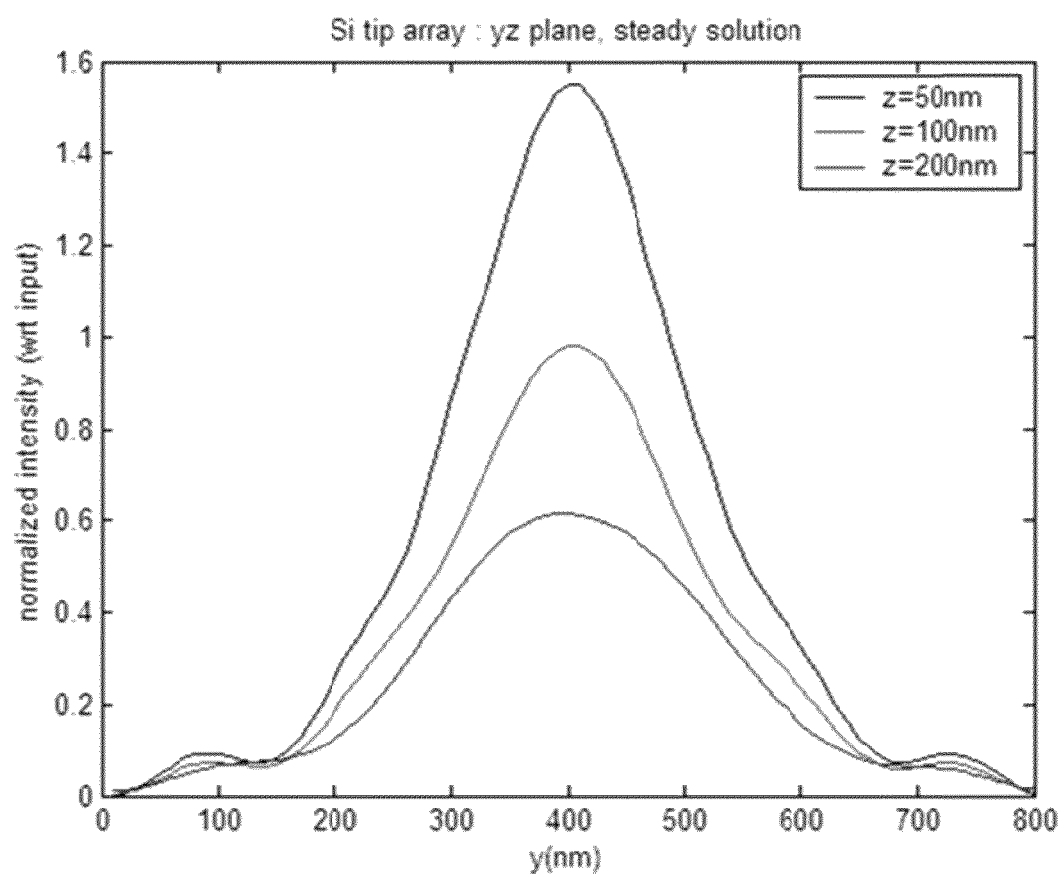
FIG. 11B, cont'd

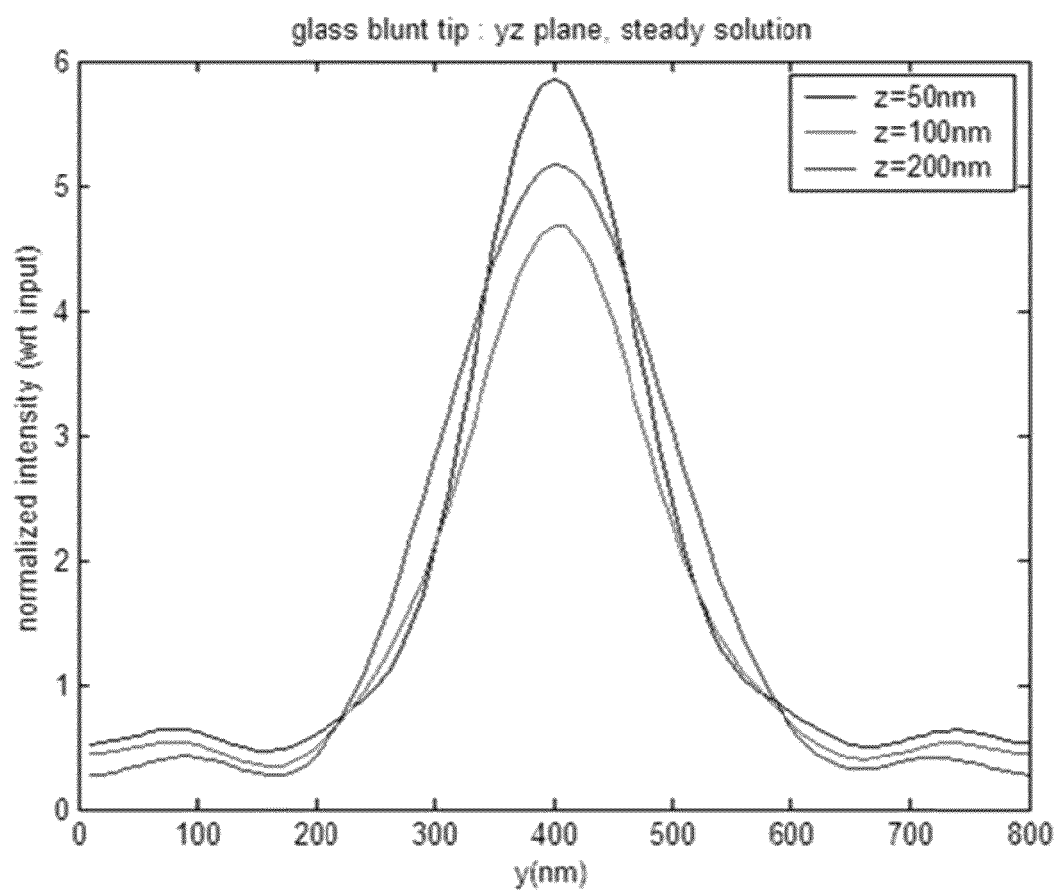
FIG. 12B, cont'd

FIG. 13

(1) Silicon aperture array

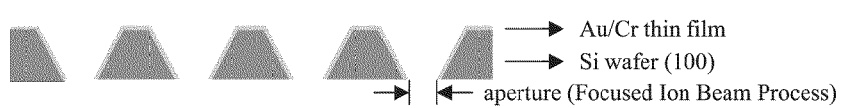 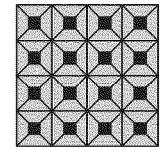

→ Au/Cr thin film
→ Si wafer (100)
→ aperture (Focused Ion Beam Process)

(Fabrication : Si anisotropic etch / metal deposition / FIB milling for aperture)

(2) Silicon aperture with microlens array

 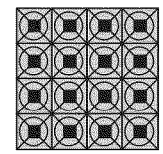

→ Microlens (Photoresitive or SiO$_2$)

(Fabrication : Si anisotropic etch / metal deposition / FIB milling for apeture / PR reflow for lens)

(3) Glass blunt tip array

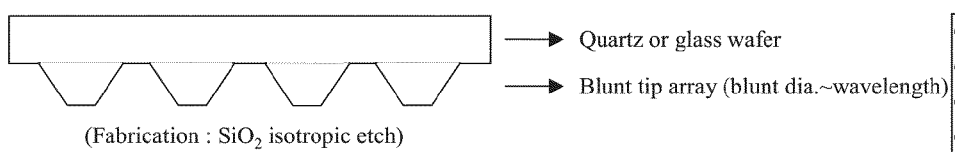 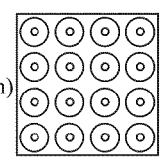

→ Quartz or glass wafer
→ Blunt tip array (blunt dia.~wavelength)

(Fabrication : SiO$_2$ isotropic etch)

FIG. 15
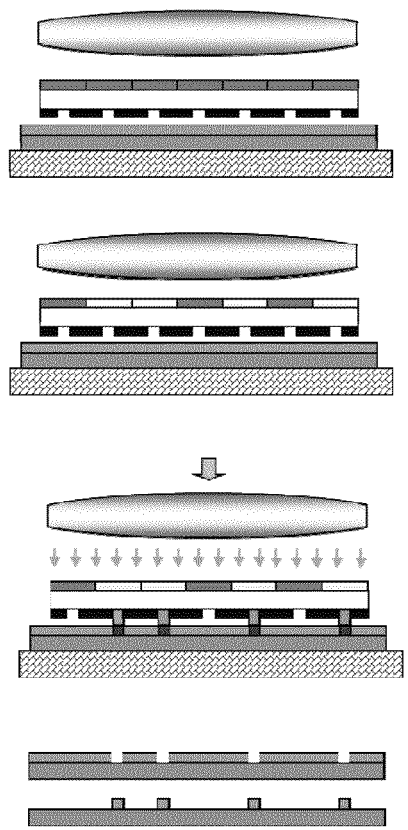
Processing Sequence (without sample scan)
 closed      ▭ open
1. Locate sample (Photoresist coated)
   : LCD normally closed
2. Load arbitrary pattern on LCD device
3. Expose selectively as loaded pattern on Photoresist
4. Develop photoresist
   (top : positive PR, bottom : negative PR)

ARBITRARY PATTERN DIRECT NANOSTRUCTURE FABRICATION METHODS AND SYSTEM

GOVERNMENT RIGHTS

This invention was made with government support under grant no. CMMI-0727841 awarded by National Science Foundation and grant no. N66001-08-1-2041 awarded by DARPA. The government has certain rights in the invention.

CROSS-REFERENCE TO RELATED APPLICATIONS

Pursuant to 35 U.S.C. §119 (e), this application claims priority to the filing dates of: U.S. Provisional Patent Application Ser. No. 61/352,694 filed on Jun. 8, 2010; the disclosure of which application is herein incorporated by reference.

INTRODUCTION

Nanomanufacturing of nanoscale devices and patterns for various applications including nanobiosensing, displays and data storage, is an area of intense research. Essentially, it requires the generation of nanostructures of metals, semiconductors, metal oxides, polymers and biologically active molecules with well-defined feature size, shape, spacing, orientation and properties. In addition, the ability to masklessly generate arbitrary nanostructures of various materials will undoubtedly contribute to new device designs (Jeong, H. J., Markle, D. A., Owen, G., Solid State Technol. 1994, 37, 39-47), the fundamental study of molecular and cell biology (Demidov, V. V., Expert Rev. Mol. Diagn. 2004, 4, 267-268) and the patterning of multiple biomolecule nanoarrays (Mendes, P. M., Yeung, C. L., Preece, J. A., Nanoscale Res Lett. 2007, 2, 373-384). Another important experimental challenge is producing controlled nanostructures on large area with targeted functionality while keeping cost at low level.

Metallic and semiconducting nanostructures are typically fabricated through conventional lithography based processes, such as e-beam lithography and deep ultraviolet (DUV) lithography. These processes are subject to limitations in that they are multi-step, utilize toxic solvents and incur high cost of implementation. In order to alleviate the limitation on high capital investment and at the same time gain substantial flexibility, a number of maskless nanopatterning approaches have been introduced, both optical and non-optical. One example of optical nanopatterning entails utilizing near-field configuration to overcome the theoretical diffraction limit. Features of size much smaller than the optical wavelength have been produced through either apertureless (Chimmalgi, A., Grigoropoulos, C. P., Komvopoulos, K., J. Appl. Phys. 2005, 97, 104319) or apertured (Hwang, D. J., Chimmalgi, A. & Grigoropoulos, C. P., J. Appl. Phys. 2006, 99, 044905; Sun, S., Montague, M., Critchley, K., Chen, M., Dressick, W. J., Evans, S. D., Leggett, G. J., Nano Letter 2006, 6(1), 29-33) near field scanning optical microscope (NSOM) instruments. However, single probe based processing is basically serial, limiting production throughput. Self-assembled array of microspheres would generate simultaneously nanofeatures over a large area, albeit only in regular and periodic (mostly, hexagonally-close-packed) patterns (Piglmayer, K., Denk, R. Bäuerle, D., Appl. Phys. Lett. 2002, 80, 4693-4695). Direct writing by optically trapped microspheres overcomes this issue and enables arbitrary nanopatterning (McLeod, E., Arnold, C., Nature Nanotechnology, 2008 3, 413-417), but the processing needs to be conducted in a liquid environment, which may limit the applicable material systems. Plasmonic lithography is an emerging technique that utilizes an air slider for maintaining precise spacing between the plasmonic lens and substrate. While this method has been demonstrated to date on optical storage materials, the high speed scanning of the slider imposes severe requirements on the substrate smoothness (Srituravanich, W., Pan, L., Wang, Y., Sun, C., Bogy, D. B., Zhang, X., Nature Nanotechnology 2008, 3, 733-737).

Essentially all the above methods require the patterning of bulk thin films. Consequently, multiple steps are needed and the processing temperature is generally high. On the other hand, non-optical processes such as nanoimprinting (Chou, S. Y., Krauss, P. R., Renstrom, P. J., Science 1996, 272 (5258), 85-87), gravure printing (Kraus, T., Malaquin, L., Schmid, H., Riess, W., Spencer, N. D., Wolf, H., Nature Nanotechnology 2007, 2, 570-576), electrodynamic printing (Park, J., Hardy, M., Kang, S. J., Barton, K., Adair K., Mukhopadhyay, D. K., Lee, C. Y., Strano, M. S., Alleyne, A. G. Georgiadis, J. G., Ferreira, P. M., Rogers, J. A., Nature Materials 2007, 6, 782-789), dip-pen (Piner, R. D, Zhu, J., Xu, F., Hong, S., Mirkin, C., Science 1999, 283 (5402), 661-663), and fluid assembly (Li, M., Bhiladvala, R. B., Morrow T. J., Sioss, J. A., Lew, K., Redwing, J. M., Keating, C. D., Mayer, T. S., Nature Nanotechnology 2008, 3, 88-92; Pauzauskie, P. J., Radenovic, A., Trepagnier, E., Shroff, H., Yang, P., Liphardt, J., Nature Materials 2006, 5, 97-101) have also been demonstrated. However, many of these processes are subject to limitations with respect to the choice of material system or require mechanical contact during processing.

SUMMARY

Aspects of the invention include a general platform for massively generating nanostructures, e.g. nanolines and nanodots, and include an entirely new route of nanomanufacturing. In certain embodiments, at least one near-field focusing element of a near-field focusing array, e.g., a microsphere array, positioned in near-field focusing relationship with a target film, e.g., a nanoparticle thin film, is selectively irradiated in a manner sufficient to produce a desired nanostructure from the target film.

In certain instances, the target film is produced from solution-carried nanoparticles, such that the solution-carried nanoparticles (e.g., 1-3 nm diameter) are used as building blocks for nanostructuring with, precise, e.g., 100 nm-200 nm, resolution. The solution deposition protocol of these embodiments eliminates the need of multiple steps and vacuum deposition and the suppressed melting temperature of nanomaterials enables low temperature processing. This process can significantly simplify the manufacturing sequence and allows potential applications that are low temperature and extremely low cost while maintaining reasonable spatial resolution and properties. The versatility of this approach also manifests itself in the ease of accommodating different material systems.

BRIEF DESCRIPTION OF THE DRAWINGS

The invention is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity. Included in the drawings are the following figures:

FIG. 1A. 3D illustration of the process. FIG. 1B. The microsphere array can be selectively illuminated (as indicated by green dots) for arbitrary patterning. FIG. 1C. Illustration of near-field laser nanoprocessing (sintering and ablation) of solution deposited nanoparticles. FIG. 1D. Experimental laser processing apparatus.

FIG. 4A. Near-field intensity distribution below the microsphere. The enhancement is relative to the incident intensity. FIG. 4B. Plots of relative intensity at two focal planes located at 240 nm and 720 nm below microsphere. The red arrow indicates the focal spot diameter. FIG. 4C. Illustration of the configuration utilized for gap control.

FIG. 5A. AFM topographical imaging of the nano-ablated structure with incident fluence of 5.31 mJ/cm$^2$, 5.05 mJ/cm$^2$ and 4.76 mJ/cm$^2$ from the top figure to the bottom. FIG. 5B. AFM cross sectional profile of a typical nano-ablated nanostructure. $2r_a$ (diameter) is defined at FWHM. FIG. 5C. Plot of ablated volume vs. incident laser fluence. FIG. 5D. Plots of ablated feature diameter and depth vs. fluence as well as the fitting result using Equation 1.

FIG. 6E. Nanodot size distribution by parallel processing. Each dot is made by one microsphere and is located at the same location in the sub-array. (FIG. 6F) The center-to-center distance distribution. (FIG. 6G) Optical image of arbitrary patterning of 'LTL' shape.

FIG. 7A. SEM imaging of sintered nanodots. i, ii, and iii depict sintering with incident laser intensity at 1.9e7 W/m$^2$ for 5 s, 4 s, 3 s respectively. iv. shows sintering with 1.6e7 W/m$^2$ for 5 s. v. is the result of sample i after washing in toluene and furnace annealing at 400° C. and vi results from iii after an identical furnace annealing step. FIG. 7B. Laser sintered dot array. Arrows indicate size variation. FIG. 7C. SEM image of nano-sintered nanowire. FIG. 7D. Nanoconductor line with laser direct written contact pads. The nanoline dimensions are 600 nm in width, 7 μm in length and 30-40 nm in thickness. FIG. 7E. Cross sectional SEM image of the sintered nanoline. FIG. 7F. The measured I-V curve for the sintered nanoconductor.

FIGS. 8A-8B. Closely spaced nanolines. FIG. 8C Illustration of the device structure. FIG. 8D. Optical dark field images of nano-electrodes. Inset shows the device without nano-electrodes. FIG. 8E. Characteristic I-V curves of the OFET with and without nano-electrodes. The drain voltage ($V_d$) was scanned from 0 to −40 V and the drain current ($I_d$) was measured while gate voltage ($V_g$) was fixed at −30, −25, −20, −15, −10, and 0V during each $V_d$ scanning.

FIG. 13: Details of various near-field focusing arrays and their fabrication methods.

FIG. 15: Schematic of a processing sequence for the arbitrary mask photolithography system, according to embodiments of the present disclosure.

DETAILED DESCRIPTION

Figure 1:
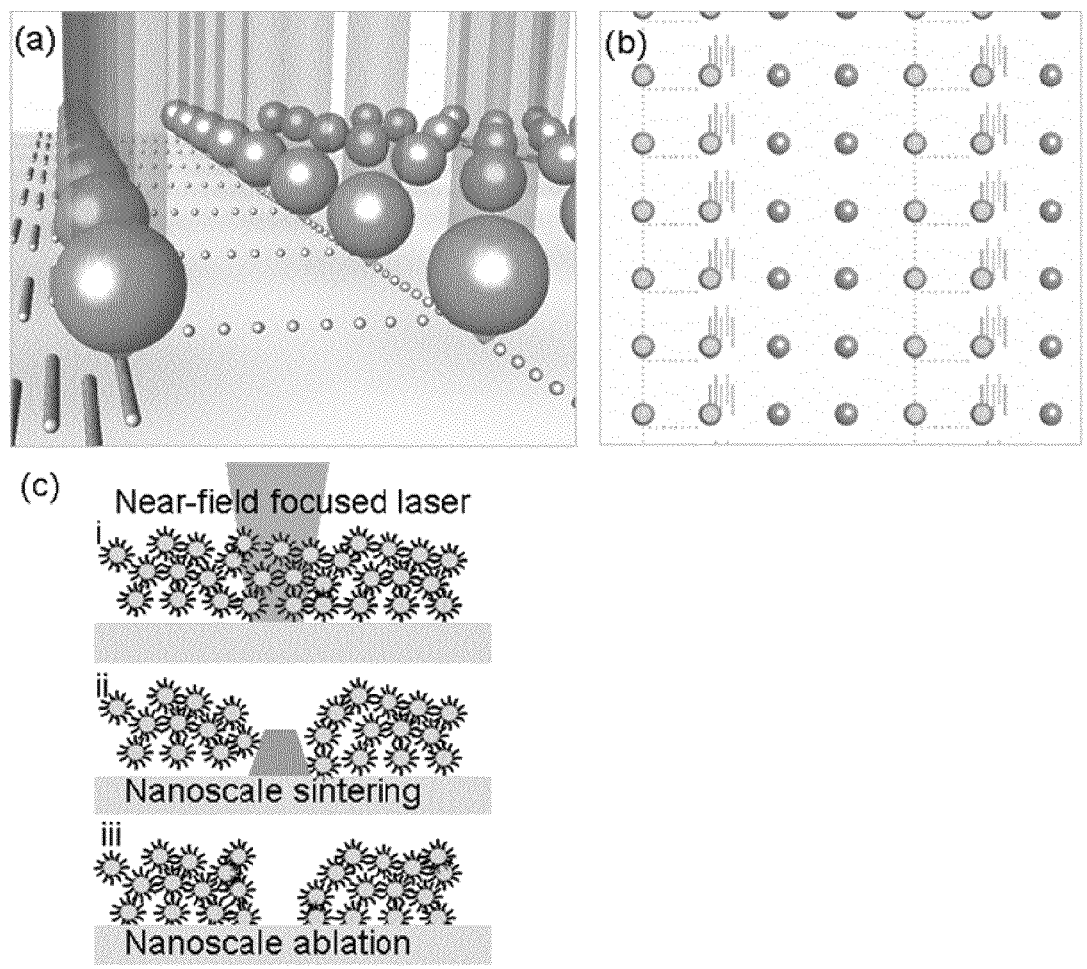
FIGS. 1A-1D. Conceptual illustrations of the high-throughput near-field nanoprocessing and experimental apparatus.

Methods of producing a nanostructure in a target film are provided. The method includes selectively irradiating at least one focusing element of a near-field focusing array that is in near-field focusing relationship with a target film in a manner sufficient to produce a nanostructure from the target film. Also provided are systems for practicing methods of the invention, as well as objects produced thereby.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating recited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be constructed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Methods

Methods of producing a nanostructure in a target film are provided. Producing a nanostructure in a target film includes selectively irradiating at least one focusing element of a near-field focusing array that is in near-field focusing relationship with a target film in a manner sufficient to produce a nanostructure from the target film. For example, a nanostructure may be produced from the target film by passing irradiation through a near-field focusing array and then contacting the focused irradiation to the target film to produce the nanostructure. The focusing element of the near-field focusing array may be irradiated in a manner sufficient to sinter or ablate the target film to produce the nanostructure.

Nanostructures

The nanostructure produced using the methods disclosed herein may vary in structure and may include any desirable one, two or three-dimensional structure, such as, but is not limited to, a sintered nanostructure (e.g., a line or wire, or a dot), an ablated nanostructure (e.g., a void, hole or trench), and the like. Other shapes and structures may be produced using the methods disclosed herein. The structure produced may be an individual structure or may be a combination of two or more structures to produce a complex structure.

In certain embodiments, a nanostructure of the present disclosure has nanoscale dimensions. By "nanoscale" is meant that the structure has dimensions on the order of nanometers in scale. For example, the nanostructure may have one or more dimensions that measure 1000 nm or less, such as 750 nm or less, or 500 nm or less, including 350 nm or less, or 200 nm or less, or 150 nm or less, or 100 nm or less, for instance 50 nm or less, or 10 nm or less, or 1 nm or less.

Embodiments of the nanostructure include sintered nanostructure, such as, but not limited to a line or wire, or a dot. In certain embodiments, the nanostructure is a dot (e.g., a nanodot). In certain instances, the dot is rounded in shape and may be approximately spherical, or in some cases, may have an irregular shape. In certain embodiments, the dot is a nanodot that has nanoscale dimensions. For example, the nanodot may have a mean diameter of 1000 nm or less, such as 750 nm or less, or 500 nm or less, including 350 nm or less, or 200 nm or less, or 150 nm or less, or 100 nm or less, for instance 50 nm or less, or 10 nm or less, or 1 nm or less. In certain instances, the nanodot has a mean diameter ranging from 1 nm to 1000 nm, such as from 10 nm to 500 nm, including from 50 nm to 200 nm.

In certain embodiments, the nanostructure includes a line (e.g., a nanoline or nanowire). The line may have a length that is greater than its width, for example a length that is two or more times greater than the width, such as a length that is 5 times or more, or 10 times or more, including 20 times or more, or 50 times or more, such as 100 times or more, or 250 times or more, or 500 times or more, or 1000 times or more greater than its width. The line may be substantially linear or may be non-linear (e.g., curved). In certain embodiments, the line is a nanoline that has nanoscale dimensions. For example, the nanoline may have a width ranging from 1 nm to 1000 nm, such as from 10 nm to 750 nm, including from 50 nm to 500 nm, or from 100 nm to 500 nm; a length ranging from 10 nm to 50 µm, such as from 100 nm to 25 µm, including from 500 nm to 10 µm; and a thickness ranging from 1 nm to 1000 nm, or from 1 nm to 500 nm, such as from 10 nm to 250 nm, including from 25 nm to 100 nm.

In certain embodiments, the nanostructure includes an ablation nanostructure. By "ablated" or "ablation" is meant that material from a surface of a substrate is removed by irradiating the substrate with an irradiation source (e.g., a laser). The ablation nanostructure may be a negative feature, which refers to surface features produced by the removal of material from the surface of a substrate, such that the negative feature extends below the surface of the substrate to a certain depth. In some cases, the ablation nanostructure includes a negative feature such as, but not limited to a void, hole or trench.

In some instances, the ablation nanostructure includes a negative feature that is a void or a hole. In certain cases, the void is rounded in shape, while in other cases the void may have an irregular shape. In certain embodiments, the void has nanoscale dimensions. For example, the void may have a mean diameter of 1000 nm or less, such as 750 nm or less, or 500 nm or less, including 300 nm or less, or 200 nm or less, or 100 nm or less, for instance 50 nm or less, or 10 nm or less, or 1 nm or less. In certain instances, the void has a mean diameter ranging from 1 nm to 1000 nm, such as from 10 nm to 500 nm, including from 50 nm to 500 nm, or from 100 nm to 300 nm. In some cases, the void has a depth ranging from 1 nm to 1000 nm, such as from 5 nm to 500 nm, or from 10 nm to 250 nm, including from 10 nm to 100 nm.

In certain embodiments, the ablation nanostructure includes a negative feature that is a trench. The trench may have a length that is greater than its width, for example a length that is two or more times greater than the width, such as a length that is 5 times or more, or 10 times or more, including 20 times or more, or 50 times or more, such as 100 times or more, or 250 times or more, or 500 times or more, or 1000 times or more greater than its width. The trench may be substantially linear or may be non-linear (e.g., curved). In certain embodiments, the trench is a nanotrench that has nanoscale dimensions. For example, the nanotrench may have a width ranging from 1 nm to 1000 nm, such as from 10 nm to 750 nm, including from 50 nm to 500 nm, or from 100 nm to 500 nm; a length ranging from 10 nm to 50 µm, such as from 100 nm to 25 µm, including from 500 nm to 10 µm; and a depth ranging from 1 nm to 1000 nm, such as from 5 nm to 500 nm, or from 10 nm to 250 nm, including from 10 nm to 100 nm.

The nanostructure may be made of any material capable of being irradiated according to the methods disclosed herein. For instance, the nanostructure may be made of a suitable material capable of being ablated or sintered to form the nanostructure according to the subject methods. Suitable materials include, but are not limited to, metals, polymers, silica (e.g., silicon dioxide), silicon, etc. In certain embodiments, the nanostructure includes a metal, such as gold.

Focusing Arrays

According to embodiments of methods of the present disclosure, producing a nanostructure in a target film includes selectively irradiating at least one focusing element of a near-field focusing array that is in near-field focusing relationship with a target film in a manner sufficient to produce a nanostructure from the target film. For example, a nanostructure may be produced from the target film by passing irradiation through a focusing array and then contacting the focused irradiation to the target film to produce the nanostructure.

In certain embodiments, the focusing array is configured to focus irradiation as the irradiation passes through the focusing array. By "focus" is meant that irradiation passing through the focusing array is directed to one or more points of convergence (i.e., focal points). Thus, the irradiation may be targeted to an area smaller than the irradiation would contact in the absence of any focusing. In some cases, the focusing array includes at least one focusing element. Each focusing element may be configured to focus the irradiation as the irradiation passes through the focusing element. The one or more focusing elements may be configured in a focusing array. An "array" includes any one-dimensional, two-dimensional or substantially two-dimensional (as well as a three-dimensional) arrangement of addressable regions. Each addressable region may include one or more focusing elements associated with that region. Any given substrate may carry one, two, four or more arrays disposed on a surface of the substrate. A focusing array may contain 1 or more, 10 or more, 25 or more, 100 or more, 500 or more, 1000 or more, or 1500 or more focusing elements. For example, the focusing array may include from 1 to 5000 focusing elements, such as from 10 to 2000 focusing elements, including from 25 to 1600 focusing elements, for example from 50 to 1000 focusing elements. As such, the one or more focusing elements may each focus the incident illuminating irradiation onto distinct target areas each corresponding to a related focusing element. The focusing array may include areas between the focusing elements that do not carry any focusing elements. The areas between the focusing elements, if present, could be of various sizes and configurations. For example, the distance between focusing elements in the focusing array may range from 1 µm to 100 µm, such as from 5 µm to 50 µm, including from 10 µm to 25 µm.

Each focusing array may cover an area of less than 100 µm², or even less than 50 µm², 10 µm² or 1 µm². In many embodiments, the substrate carrying the one or more focusing arrays will be shaped generally as a rectangular solid (although other shapes are possible), having a length of 5 mm or less, such as 2 mm or less, including 1 mm or less; a width of 5 mm or less, such as 2 mm or less, including 1 mm or less; and a thickness of 5 mm or less, such as 2 mm or less, including 1 mm or less. With focusing arrays that are config-ured to focus irradiation, the substrate may be of a material that substantially allows the irradiation to be transmitted through the substrate. For example, the substrate may be relatively transparent to reduce the absorption of the incident illuminating irradiation (e.g., laser light). For example, substrate may transmit 20% or more, or 50% or more, or 70% or more, or 90% or more, or 95% or more, or 99% or more of the incident illuminating irradiation as may be measured across the entire integrated spectrum of such illuminating irradiation. In some instances, the substrate is composed of a polymer, a photoresist compound, silicon dioxide, borosilicate glass (e.g., Pyrex glass), and the like. In certain cases, the substrate is composed of borosilicate glass (e.g., Pyrex glass). In some instances, the substrate is substantially planar.

As described above, in certain embodiments, the focusing element is configured to focus the irradiation as the irradiation passes through the focusing element. The focusing element may have microscale dimensions. By "microscale" is meant that the structure has dimensions on the order of micrometers in scale. For example, the nanostructure may have one or more dimensions that measure 1000 µm or less, such as 750 µm or less, or 500 µm or less, including 250 µm or less, or 100 µm or less, for instance 50 µm or less, or 10 µm or less, or 5 µm or less, or 1 µm or less, or 0.5 µm or less.

In some cases, the focusing element is an aperture, a lens or a projection, such as a microaperture, a microlens, or a microprojection. In certain instances, the focusing element is an aperture, such as a microaperture. An aperture is a hole or an opening through which light travels. The aperture may be arranged in a focusing array that includes one or more apertures as described above, such that the focusing array includes an array of microapertures (e.g., a microaperture array). A focusing array may contain 1 or more, 10 or more, 25 or more, 100 or more, 500 or more, 1000 or more, or 1500 or more apertures. For example, the focusing array may include from 1 to 5000 apertures, such as from 10 to 2000 apertures, including from 25 to 1600 apertures, for example from 50 to 1000 apertures.

In certain instances, the aperture is formed by etching a substrate. For example, a silicon substrate may be etched, for instance using anisotropic etching techniques, such as, but not limited to, reactive-ion etching (RIE), deep reactive-ion etching (DRIE), and the like. Following etching, the substrate may be coated with one or more layers, such as a thin layer of metal. The substrate may be coated with a thin layer of metal using any convenient technique for producing thin layers of metal, such as, but not limited to, chemical vapor deposition, sputtering, cathodic arc deposition, and the like. In some instances, the thin layer of metal includes gold, chromium, platinum, tantalum, combinations thereof, and the like. The thin layer of metal may have a thickness of 100 nm or less, such as 50 nm or less, including 20 nm or less, or 10 nm or less. For example, a thin film of chromium (e.g., 20 nm thick) may be disposed on the substrate. In some instances, a thin film of gold (e.g., 50 nm thick) may be disposed on the thin film of chromium. Final formation of the aperture may be performed by removing the remaining substrate in the aperture that was not completely removed during the etching process, for example by focused ion beam milling. The aperture may have a diameter of 10 µm or less, such as 5 µm or less, including 1 µm or less, for instance, 0.5 µm or less, or 0.2 µm or less, or 0.1 µm or less. In some cases, the aperture has a diameter of 0.2 µm (i.e., 200 nm). In some instances, the aperture diameter is measured as full width at half maximum (FWHM), such as full width at half maximum depth of the aperture.

In certain embodiments, the focusing element is a lens, such as a microlens. The lens may be arranged in a focusing array that includes one or more lenses as described above, such that the focusing array includes an array of microlenses (e.g., a microlens array). A focusing array may contain 1 or more, 10 or more, 25 or more, 100 or more, 500 or more, 1000 or more, or 1500 or more lenses. For example, the focusing array may include from 1 to 5000 lenses, such as from 10 to 2000 lenses, including from 25 to 1600 lenses, for example from 50 to 1000 lenses.

In some embodiments, the lens is configured as an aperture with a lens. The aperture may be similar to the aperture described above and, in addition, the aperture may include a lens positioned in the aperture. For example, the aperture may have a diameter of 10 µm or less, such as 5 µm or less, including 1 µm or less, for instance, 0.5 µm or less, or 0.2 µm or less, or 0.1 µm or less, as described above. Similarly, the aperture may be etched in a silicon substrate and coated with one or more thin layers of metal, as described above.

The lens may be configured such that the lens substantially fills the aperture, such that irradiation passing through the aperture is transmitted through the lens. In certain instances, the lens has a rounded surface, which in some instances may be a spherical surface. In some cases, the rounded surface may be the surface that the incident illuminating irradiation contacts first. In these cases, the rounded surface of the lens may facilitate the focusing of the incident illuminating irradiation onto the target film. The lens may have a radius of curvature ranging from 5 µm or less, such as 1 µm or less (i.e., 1000 nm or less), including 700 nm or less, 600 nm or less, 500 nm or less, 400 nm or less, 300 nm or less, 200 nm or less, or 100 nm or less. In some instances, the lens has a radius of curvature of 400 nm. In some cases, the lens is composed of a material configured to transmit the incident illuminating irradiation through the lens while focusing the incident illuminating irradiation as desired. For example, the lens may be composed of a polymer, a photoresist compound, silicon dioxide, borosilicate glass (e.g., Pyrex glass), and the like. In certain cases, where the lens is composed of a photoresist compound, the lens may be formed by a photoresist reflow process, where the photoresist compound is first deposited on the substrate (e.g., in the aperture) and then heated to reflow the photoresist compound into a lens having a rounded surface.

In certain instances, the lens is configured as a sphere (e.g., a spherical lens), such as a microsphere (e.g., a microspherical lens). As described herein, the sphere need not be completely spherical in shape, and may only be approximately spherical in shape. The shape of the sphere may be uniform or irregular, so long as the sphere is configured to focus the incident illuminating irradiation onto the target film as desired. In some cases, the sphere is composed of a material configured to transmit the incident illuminating irradiation through the sphere while focusing the incident illuminating irradiation as desired. For example, the sphere may be composed of a polymer, a photoresist compound, silicon dioxide, borosilicate glass (e.g., Pyrex glass), and the like.

The sphere may be arranged in a focusing array that includes one or more spheres as described above, such that the focusing array includes an array of microspheres (e.g., a microsphere array). A focusing array may contain 1 or more, 10 or more, 25 or more, 100 or more, 500 or more, 1000 or more, or 1500 or more spheres. For example, the focusing array may include from 1 to 5000 spheres, such as from 10 to 2000 spheres, including from 25 to 1600 spheres, for example from 50 to 1000 spheres. In certain embodiments, the sphere may have a mean diameter of 25 µm or less, such as 10 µm or less, including 5 µm or less, for instance, 3 µm or less. For example, the sphere may have a mean diameter of 3 µm.

In some cases, the substrate carrying the array of spheres is composed of a material configured to substantially transmit the incident illuminating irradiation through the substrate. For example, the substrate may be relatively transparent to reduce the absorption of the incident illuminating irradiation (e.g., laser light). For example, substrate may transmit 20% or more, or 50% or more, or 70% or more, or 90% or more, or 95% or more, or 99% or more of the incident illuminating irradiation as may be measured across the entire integrated spectrum of such illuminating irradiation. In some instances, the substrate is composed of a polymer, a photoresist compound, silicon dioxide, borosilicate glass (e.g., Pyrex glass), and the like. In certain cases, the substrate is composed of borosilicate glass (e.g., Pyrex glass).

The microspheres may be stably associated with the surface of the substrate or support. By stably associated is meant that the microspheres do not substantially disassociate from the surface of the substrate during the method. In some cases, the microspheres are annealed to the surface of the substrate by heating the microspheres. Annealing the microspheres to the surface of the substrate may facilitate stable association of the microspheres with the surface of the substrate.

In certain embodiments, the microspheres are arranged on the surface of the substrate or support in a regular pattern. For example, the microspheres may be arranged on the surface of the substrate in an array. The microspheres may be arranged in rows and columns where the spacing between each microsphere is substantially the same throughout the array. For example, the distance between the microspheres in the focusing array may range from 1 µm to 100 µm, such as from 5 µm to 50 µm, including from 10 µm to 25 µm. In some instances, the distance between microspheres in the focusing array is 15 µm.

In certain embodiments, the focusing element is a projection, such as a microprojection. A projection is a structure that extends from the surface of a substrate through which light travels. The projection may be configured to focus the incident illuminating irradiation onto the target film as desired. For example, in some cases, the projection has a tapered shape, such that the projection has a larger cross sectional area proximal to the substrate and a smaller cross sectional area distal to the substrate. In some cases, the projection has a cross sectional area that gradually decreases from the end of the projection proximal to the substrate towards the end of the projection distal to the substrate. In certain instances, the projection has a shape of a cone, a pyramid, a truncated cone, a truncated pyramid, and the like. The incident illuminating irradiation may pass through the projection from the end of the projection having the greater cross sectional area towards the end of the projection having the smaller cross sectional area. In this manner, the projection may facilitate focusing of the incident illuminating irradiation onto the target film as desired.

The projection may be arranged in a focusing array that includes one or more projections as described above, such that the focusing array includes an array of microprojections (e.g., a microprojection array). A focusing array may contain 1 or more, 10 or more, 25 or more, 100 or more, 500 or more, 1000 or more, or 1500 or more projections. For example, the focusing array may include from 1 to 5000 projections, such as from 10 to 2000 projections, including from 25 to 1600 projections, for example from 50 to 1000 projections. The projection may have a tip diameter of 10 µm or less, such as 5 µm or less, including 1 µm or less, for instance, 0.5 µm or less, or 0.2 µm or less, or 0.1 µm or less. In some cases, the projection has a tip diameter of 0.2 μm (i.e., 200 nm). In some cases, the projection is composed of a material configured to transmit the incident illuminating irradiation through the projection while focusing the incident illuminating irradiation onto the target film as desired. For example, the projection may be composed of a polymer, a photoresist compound, silicon dioxide, borosilicate glass (e.g., Pyrex glass), and the like.

Although focusing elements configured as an aperture, an aperture with a lens, a lens (e.g., a microsphere), and a projection are described above, any of a variety of other configurations for the focusing elements may be used. For example, the focusing elements may be configured as elongated structures, such as a wire (e.g., a nanowire), dots (e.g., nanodots or an array of nanodots), and the like.

Selective Irradiation

As indicated above, aspects of embodiments of the methods include producing a nanostructure in a target film by selectively irradiating at least one focusing element of a near-field focusing array that is in near-field focusing relationship with a target film in a manner sufficient to produce a nanostructure from the target film. By "selectively irradiating" is meant that one or more individual focusing elements may be irradiated by the incident illuminating irradiation while the other focusing elements are not directly contacted with the incident illuminating irradiation. A user may individual select which focusing element(s) are irradiated by the incident illuminating irradiation, and which focusing element(s) are not contacted with the incident illuminating irradiation. For example, selectively irradiating at least one focusing element may include irradiating one or more focusing elements in a predetermined manner. As described above, the focusing elements may be arranged in an array configuration on a substrate. The array may include an arrangement of addressable regions, where each addressable region may include one or more focusing elements. By "addressable" is meant that individual regions or focusing elements may be selectively irradiated.

The focusing elements may be selectively irradiated by irradiation from an irradiation source. In certain embodiments, the irradiation source is a light source, such as a laser light source. For example, the irradiation source may include, but is not limited to, a neodymium-doped yttrium aluminum garnet (Nd:YAG) laser (e.g., a Q-switched Nd:YAG laser), an argon laser, a ruby laser, and the like.

In certain embodiments, selective irradiation may be achieved by irradiating an optical switching device that is in transmissive relationship with the focusing array. The optical switching device may include one or more individually controllable regions. The individually controllable regions may be individually configured to substantially transmit the incident illuminating irradiation through the optical switching device to the focusing array, or substantially block the incident illuminating irradiation from being transmitted through the optical switching device. If a region of the optical switching device is configured to substantially transmit the incident illuminating irradiation through the optical switching device, the incident illuminating irradiation may pass through the region to the focusing array, which then focuses the incident illuminating irradiation onto the target film. If a region of the optical switching device is configured to substantially block the incident illuminating irradiation from being transmitted through the optical switching device, then the incident illuminating irradiation will not pass through the optical switching device and the target film will not be contacted by the incident illuminating irradiation. In certain embodiments, the optical switching device includes an LCD. In these embodiments, individual regions of the LCD may be selectively configured to transmit the incident illuminating irradiation through the LCD or selectively configured to block the incident illuminating irradiation from being transmitted through the LCD. For example, individual regions of the LCD may be made substantially transparent to the incident illuminating irradiation or substantially opaque to the incident illuminating irradiation, for example by the application of an appropriate electrical current to the desired regions of the LCD.

In certain embodiments, selective irradiation may be achieved by irradiating a digital micromirror device (DMD). A digital micromirror device includes a plurality of microscopic mirrors arranged in an array on its surface. Each mirror corresponds to a focusing element, which in turn corresponds to a region of the target film to be irradiated by the incident illuminating irradiation. The mirrors can be individually rotated (e.g., ±10-12°), to an "on" or "off" state. In the "on" state, the mirror is positioned such that the incident illuminating irradiation is reflected onto the corresponding focusing element, which in turn focuses the incident illuminating irradiation onto the target film. In the "off" state, the mirror is positioned such that the incident illuminating irradiation is directed elsewhere, such that the incident illuminating irradiation does not contact the focusing element, and thus does not contact the target film. Each mirror in the DMD can be individually positioned in the "on" or "off" state, such that individual focusing elements may be selectively irradiated by the incident illuminating irradiation.

In certain embodiments, selective irradiation of the focusing elements facilitates the production of nanostructures without using a mask. As described above, individual focusing elements, and thus, individual regions of the target film may be selectively irradiated using the subject methods and systems. Accordingly, in certain embodiments, a photolithography mask is not required to produce patterns (e.g., nanostructures) in the target film. In certain instances, the subject methods are maskless methods for producing nanostructures in a target film.

Target Film

According to embodiments of the present disclosure, a target film is a film disposed on a surface of a substrate from which a nanostructure is formed using the disclosed methods. Thus, the target film may be configured to form one or more nanostructures after being contacted with the incident illuminating irradiation. For example, the target film may be configured to form one or more nanostructures upon sintering or ablating by the incident illuminating irradiation. In certain embodiments, the target film is configured to have a substantially uniform thickness across the surface of the substrate covered by the target film, as described above. In some cases, the target film is a thin film disposed on the surface of the substrate. For example, the target film may have a thickness ranging from 1 nm to 1000 nm, such as from 10 nm to 500 nm, including from 50 nm to 200 nm. In some cases, the target film has a thickness of 100 nm.

In certain embodiments, the target film is a nanoparticle film. In these embodiments, the target film includes a plurality of nanoparticles. The nanoparticles may be arranged into a film on the substrate surface. In some instances, the nanoparticles are arranged in a substantially uniform layer on the surface of the substrate, such that the target film has a substantially uniform thickness across the surface of the substrate covered by the target film, as described above. In certain embodiments, the nanoparticles are arranged in a nanoparticle thin film. For example, the nanoparticle thin film may have a thickness ranging from 1 nm to 1000 nm, such as from 10 nm to 500 nm, including from 50 nm to 200 nm. In some cases, the target film has a thickness of 100 nm. In certain instances, the nanoparticles are substantially spherical. In other embodiments, the nanoparticles have other shapes, such as irregular shapes. In some cases, the nanoparticles have a mean diameter ranging from 1 nm to 50 nm, such as from 1 nm to 25 nm, including from 1 nm to 10 nm, or from 1 nm to 5 nm, or from 1 nm to 3 nm.

The nanoparticles in the target film may be configured to form one or more nanostructures upon sintering or ablating by the incident illuminating irradiation. As such, the nanoparticles may be composed of a suitable material capable of being ablated or sintered to form the nanostructure according to the subject methods. Suitable materials include, but are not limited to, metals, polymers, resins (e.g., lithographic resins, polymerizable resins), silica (e.g., silicon dioxide), silicon, biomaterials, etc. In certain embodiments, the nanoparticles include a metal, such as gold. In some cases, the nanoparticles include a coating on the surface of the nanoparticle. The coating may be configured to increase the stability of the nanoparticles and/or reduce the occurrence of agglomeration of the nanoparticles. In certain instances, the coating may include an organic compound, such as, but not limited to, hexanethiol.

In certain embodiments, the target film is produced by depositing fluid medium comprising nanoparticles a surface of a substrate or support. As such, the target film may be a fluid cast nanoparticle thin film. In some cases, where the target film is a nanoparticle film, the target film may be produced by depositing a suspension of nanoparticles onto the surface of the substrate. Depositing the fluid medium comprising the nanoparticles onto the surface of the substrate may include, but is not limited to, spraying, dipping, drop deposition, and the like. In some cases, the thickness of the target film may depend on factors such as the amount of target film solution deposited on the substrate, the concentration of nanoparticles, the solvent used, the evaporation rate of the solvent, the ambient temperature, etc. In certain instances, a target film with a substantially uniform thickness is produced by spin coating the target film onto the substrate. In some cases, spin coating includes depositing the target film solution or suspension of nanoparticles onto the surface of the substrate and then rotating the substrate to substantially evenly distribute the solution on the surface of the substrate by centrifugal force. Rotation of the substrate may be continued until the desired thickness of the target film is achieved. Thus, the higher the angular speed of rotation, the thinner the film. In some instances, the applied solvent is volatile, and simultaneously evaporates. In certain cases, the substrate is substantially planar. A substantially planar substrate may facilitate uniform coating of the substrate.

In certain embodiments, the method further includes separating the fluid from the nanoparticles in a manner sufficient to produce the nanoparticle thin film. Separating the fluid from the nanoparticles may include evaporating the fluid from the surface of the substrate. In certain instances, evaporating the fluid leaves the nanoparticles on the surface of the substrate. The nanoparticles may be stably associated with the surface of the substrate or support. By stably associated is meant that the nanoparticles do not substantially disassociate from the surface of the substrate during the method. In some cases, the nanoparticles are annealed to the surface of the substrate by heating the nanoparticles. Annealing the nanoparticles to the surface of the substrate may facilitate stable association of the nanoparticles with the surface of the substrate.

In certain embodiments, the target film is applied directly to the substrate. The substrate may be composed of a polymer, silicon dioxide, borosilicate glass (e.g., Pyrex glass), and the like. In some instances, the substrate has one or more layers disposed on its surface before being coated with the target film. For example, the substrate may have an electrically conductive layer disposed on a surface of the substrate. In some cases, the electrically conductive layer is also optically transparent. For instance, the substrate may have a layer of indium tin oxide disposed on its surface. In certain embodiments, the substrate has an electrically insulating layer disposed on the electrically conductive layer. For example, the substrate may have a dielectric layer disposed on the electrically conductive layer. The dielectric layer may include, but is not limited to, porcelain, glass, plastic, polymers, and the like. In some cases, the dielectric layer includes a polymer, such as poly-4-vinylphenol.

Near-Field Focusing Relationship

As indicated above, aspects of embodiments of the methods include producing a nanostructure in a target film by selectively irradiating at least one focusing element of a near-field focusing array that is in near-field focusing relationship with a target film in a manner sufficient to produce a nanostructure from the target film. Accordingly, the near-field focusing array is in a near-field focusing relationship with the target film. By "near-field" is meant a distance less than three, such as less than two, including less than one wavelength of the incident illuminating irradiation. For example, the distance or gap between the focusing array and the target film may range from 1 nm to 1000 nm, such as from 10 nm to 1000 nm, including from 25 nm to 1000 nm, or from 50 nm to 1000 nm, or from 50 nm to 750 nm, or from 50 nm to 500 nm, for example from 50 nm to 250 nm.

In certain instances, the focusing array and the target film are in a parallel planar relationship to each other. As described above, the substrate carrying the focusing array and the substrate carrying the target film may each be substantially planar. As such, the focusing array and the target film may be arranged such that the substrate carrying the focusing array is substantially parallel to the substrate carrying the target film. When the focusing array and the target film are substantially parallel, the focusing array and target film may be separated by a gap. The thickness of the gap between the focusing array and the target film may be substantially the same across the opposing surfaces of the focusing array and the target film. In certain embodiments, the gap between the focusing array and the target film is a gas-filled gap. The gap may be a gas-filled gap, such that the opposing surfaces of the focusing array and the target film do not contact each other, but remain separated by at least a minimum distance. In some cases, the gas-filled gap may include a gas between the focusing array and the target film. For example, the gas may include air, nitrogen, argon, etc. In certain embodiments, the gap between the focusing array and the target film does not include a fluid (e.g., a gas or a liquid). For example, the gap between the focusing array and the target film may not be filled with a fluid. In some cases, the gap between the focusing array and the target film may include a vacuum space between the focusing array and the target film.

In certain embodiments, the focusing array includes one or more electrodes. The electrodes may be arranged on the surface of the focusing array opposite the facing surface of the target film. The electrodes may be configured to form a capacitor that includes the electrodes, the electrically conductive layer disposed on the surface of the substrate carrying the target film, and the dielectric layer disposed on the electrically conductive layer. In certain instances, the capacitor may be used to determine the distance between the focusing array and the target film. For example, the distance between the focusing array and the target film may be determined by measuring the capacitance. As such, the method may include the step of determining the distance between the focusing array and the target film. In some cases, the determining the distance include measuring the capacitance between the electrodes on the surface of the focusing array and the electrically conductive layer disposed on the substrate carrying the target film, and determining the distance between the focusing array and the target film based on the capacitance. Accordingly, based on the measured capacitance, the distance between the focusing array and the target film can be determined. In some cases, the capacitance ranges from 1 pF to 25 pF, such as from 1 pF to 15 pF, including from 1 pF to 10 pF. In certain embodiments, the gap between the focusing array and the target film is configured such that the laser fluence ranges from 1 mJ/cm$^2$ to 50 mJ/cm$^2$, such as from 1 mJ/cm$^2$ to 25 mJ/cm$^2$, including from 2 mJ/cm$^2$ to 10 mJ/cm$^2$.

The type of irradiation used in the methods of the present disclosure may vary and can include a laser, a filtered irradiation source, a collimated irradiation source, and the like. For example, various types of lasers may be used, such as, but not limited to, continuous wave lasers (e.g., non-pulsed lasers), temporally modulated lasers (e.g., pulsed lasers, such as, but not limited to, nanosecond lasers, picosecond lasers, femtosecond lasers, etc.), and the like. In some instances, short laser pulses facilitate improved spatial resolution and improved aspect ratio for the produced nanostructures. For example, in certain embodiments, the subject methods and systems provide for production of nanostructures with a resolution (e.g., distance between the produced nanostructures) of 10 μm or less, such as 5 μm or less, including 1 μm or less, or 750 nm or less, or 500 nm or less, such as 250 nm or less, or 100 nm or less, for instance 75 nm or less, or 50 nm or less, or 25 nm or less, including 10 nm or less, or 5 nm or less, or 3 nm or less, for example 1 nm or less. The lasers may have any desired wavelength, such as, but not limited to, ultraviolet lasers, visible light lasers, near-infrared lasers, infrared lasers, and the like. In some instances, one laser source is used to irradiate the target film. In other embodiments, two or more laser sources are used to irradiate the target film. In certain cases, the irradiation used includes, but is not limited to, ultraviolet irradiation, infrared irradiation, near-infrared irradiation, and the like. In some embodiments, the irradiation used includes a filtered irradiation, such as, but not limited to, filtered ultraviolet irradiation, filtered infrared irradiation, filtered near-infrared irradiation, and the like.

Ablation

In certain embodiments, selectively irradiating the target film in a manner sufficient to produce a nanostructure from the target film includes ablating the target film to produce the nanostructure. By "ablated" or "ablation" is meant that material from a surface of a substrate is removed by irradiating the substrate with an irradiation source (e.g., a laser). For instance, the near-field focusing array may be selectively irradiated in a manner sufficient to ablate a portion of the target film. As described above, the ablation nanostructure may be a negative feature, such as a void or hole. In some cases, two or more holes may be produced adjacent each other such that an elongated structure (e.g., a trench) is produced.

Sintering

In certain embodiments, selectively irradiating the target film in a manner sufficient to produce a nanostructure from the target film includes sintering the target film to produce the nanostructure. By "sintering" is meant that materials in the target film (e.g., nanoparticles in the target film) are heated by an irradiation source (e.g., a laser), such that the materials adhere to each other. For instance, the near-field focusing array may be selectively irradiated in a manner sufficient to sinter a portion of the target film. As described above, the sintered nanostructure may include a dot. In some cases, two or more dots may be produced adjacent each other such that an elongated structure (e.g., a line or wire) is produced.

In certain embodiments, a complex nanostructure may be produced using the methods of producing a nanostructure disclosed herein. By complex nanostructure is meant that two or more nanostructures may be produced in close proximity to each other such that the two or more nanostructures may be associated with each other to form a larger structure that includes the two or more nanostructures. For example, the methods of producing a nanostructure may be used to produce an organic field effect transistor (OFET). An OFET is a field effect transistor that includes an organic semiconductor arranged between two electrodes. In some instances, the electrodes of the OFET may be produced by the methods for producing a nanostructure as disclosed herein. For example, a first electrode wire and a second electrode wire may be produced by sintering a target film. In some cases, the electrodes are produced such that the distance between the first electrode and second electrode is from 10 nm to 1000 nm, such as from 100 nm to 1000 nm, including from 500 nm to 1000 nm.

Systems

Systems of embodiments of the present disclosure include a near-field focusing array, a holder for positioning a target film in a parallel planar relationship with the near-field focusing array, an irradiation source, and a selective irradiator configured to selectively irradiate the near-field focusing array with irradiation from the irradiation source.

In certain embodiments, as described above, the near-field focusing array is configured to focus irradiation onto the target film as the irradiation passes through the focusing array. In some cases, the focusing array includes at least one focusing element. Each focusing element may be configured to focus the irradiation as the irradiation passes through the focusing element. As described in detail above, the focusing element may be an aperture, a lens or a projection, such as a microaperture, a microlens, or a microprojection.

Aspects of the systems include a holder for positioning a target film in a parallel planar relationship with the near-field focusing array. As described above, the substrate carrying the focusing array and the substrate carrying the target film may each be substantially planar. As such, the focusing array and the target film may be arranged such that the substrate carrying the focusing array is substantially parallel to the substrate carrying the target film. The holder may be configured to hold the target film. In some cases, the holder is adjustable, such that the target film may be positioned in the desired arrangement relative to the focusing array (e.g., in a parallel planar relationship). For example, the holder may be configured to adjust the angle of the surface of the target film relative to the opposing surface of the focusing array. The holder may be adjustable such that the surface of the target film is substantially parallel to the opposing surface of the focusing array.

In certain embodiments, the holder is configured to linearly translate the target film relative to the focusing array. Linear translation of the target film relative to the focusing array may allow for the production of two or more nanostructures in close proximity to each other. For example, as described above, a sintered nanostructure may include a dot, and in some cases, two or more dots may be produced adjacent each other such that an elongated structure (e.g., a line or wire) is produced. In embodiments where a line or wire is produced, linear translation of the target film relative to the focusing array may be used to offset the target film from its initial position, such that two or more dots are formed adjacent each other to produce the line or wire. Similarly, as described above, an ablation nanostructure may include a void or hole, and in some cases, two or more voids or holes may be produced adjacent each other such that an elongated structure (e.g., a trench) is produced. In embodiments where a trench is produced, linear translation of the target film relative to the focusing array may be used to offset the target film from its initial position, such that two or more holes are formed adjacent each other to produce the trench structure. In certain embodiments, the target film holder is configured to be linearly translatable. In other embodiments, the focusing array is configured to be linearly translatable. In yet other embodiments, both the target film holder and the focusing array are configured to be independently linearly translatable.

Embodiments of the system also include an irradiation source. The irradiation source is configured to provide irradiation. The irradiation provided by the irradiation source is transmitted through the near-field focusing array (e.g., transmitted through one or more of the focusing elements of the focusing array) to the target film. The system may further include irradiation directing elements (e.g., optical components), such as one or more objective lenses, one or more mirrors, and the like.

In certain embodiments, the system includes a selective irradiator configured to selectively irradiate the near-field focusing array with irradiation from the irradiation source. The selective irradiator may be configured to partially transmit and partially block the incident illuminating irradiation. For example, the selective irradiator may include an optical switching device. As described above, the optical switching device may include one or more individually controllable regions. The individually controllable regions may be individually configured to substantially transmit the incident illuminating irradiation through the optical switching device to the focusing array, or substantially block the incident illuminating irradiation from being transmitted through the optical switching device. In certain instances, the selective irradiator includes an optical switching device, such as, but not limited to, a selectively transmissive optical switching device (e.g., an LCD). In some cases, the selective irradiator includes a direct electrical switching device, such as, but not limited to, a light emitting diode (LED), such as an array of LEDs, or a laser diode (LD), such as an array of LDs.

In certain embodiments, the selective irradiator may be configured to selectively direct a portion of the incident illuminating irradiation to the focusing array. For instance, the selective irradiator may include a digital micromirror device (DMD). As described in detail above, a digital micromirror device includes a plurality of individually adjustable mirrors that can be individually positioned to direct the incident illuminating irradiation either towards the focusing array or away from the focusing array.

In certain embodiments, the system includes optical components. The optical components may be configured to allow observation of the focusing array and/or the target film during the nanoparticle production method. The optical components may include one or more objective lenses, one or more mirrors, one or more detectors, and the like. For example, the one or more detectors may include one or more image sensors, such as, but not limited to, a charge-coupled device (CCD), a complementary metal-oxide-semiconductor (CMOS), and the like. In certain embodiments, the one or more optical components are configured to allow observation of the focusing array and the target film from two different directions. For example, a first set of optical components may be configured to allow observation the focusing array and/or the target film from a first direction, such as from a side of the target film opposite the focusing array. In some cases, a second set of optical components may be configured to allow observation the focusing array and/or the target film from a second direction, such as from a side of the focusing array opposite the target film.

In certain embodiments, the system further includes one or more actuators. The actuators may be configured to provide linear translation of the holder. The one or more actuators may be configured to provide linear translation of the holder along one or more axes. For example, the one or more actuators may be configured to provide linear translation of the holder along the x-axis, along the y-axis, along the z-axis, or any combination of the above. The one or more actuators may be configured to provide linear translation of the holder in any direction in two or three dimensions. For example, as described above, one or more actuators may be configured to provide linear translation of the holder in two or more dimensions. In some cases, linear translation of the holder facilitates the production of two or more nanostructures in close proximity to each other. In some instances, the one or more actuators may be configured to allow for the adjustment of the distance between the focusing array and the target film. In these embodiments, the system may further include a processor configured to operate the one or more actuators to adjust the distance between the focusing array and the target film. In certain embodiments, the one or more actuators include, but are not limited to, a piezo-actuator, a pneumatic actuator, a hydraulic actuator, a comb-drive actuator, an electro-mechanical actuator, and the like.

Utility

Embodiments of the subject methods and systems find use in a variety of different applications where it is desired to produce nanostructures. The subject methods and systems find use in the production of one, two and three-dimensional nanostructures, such as, but not limited to, dots, lines or wires, voids or holes, trenches, and the like. For example, the subject methods and systems find use in the production of electrically conductive wires and electrodes by sintering the target film into the desired wire or electrode nanostructures. Other micro and/or nano-scale components may be produced using the subject methods and systems, such as, but not limited to, components for MEMS devices, NEMS devices, and the like. Examples of such components include optical materials and electro-optical components, etc.

The subject methods and systems also find use in two-photon polymerization and multi-photon polymerization techniques. For example, the subject methods and systems may be used to polymerize a photosensitive material to produce three-dimensional cross-linked polymers. For instance, the subject methods and systems find use in the production of three-dimensional photonic crystals. Three-dimensional photonic crystals may find use in telecommunication applications as all-optical signal processing, and also as transistors for light and optical computers.

The subject methods and systems also find use in biomedical applications, such as, but not limited to, the production of biomaterials and tissue engineering. For example, the subject methods and systems may be used to produce three-dimensional scaffolds whose function is to guide and support cell proliferation in three dimensions for the artificial fabrication of a living tissue (e.g., for transplantation into a host). Two-photon polymerization and multi-photon polymerization may be used for the fabrication of these three-dimensional scaffolds.

The subject methods and systems find use in the production of drug delivery devices. The subject methods and systems may be used to produce micro-scale or nano-scale drug delivery devices. For example, the subject methods and systems may be used to produce microneedle arrays with various geometries suitable for use in transdermal drug delivery devices.

The subject methods and systems also find use in optical metrology. For example, the subject methods and systems find use in microscopy, such as microscopy having nanometer-scale resolution. As described above, the subject systems may include optical components configured to allow observation of the focusing array and/or the target film during production of the nanostructures. In certain embodiments, the optical components may be configured to provide microscopy having nanometer-scale resolution.

EXPERIMENTAL

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

I. Microsphere Array Mediated Nanostructure Production

A. Introduction

In solution processing, in general, materials are deposited in solution phase (e.g. printing) followed by nanopatterning and/or annealing steps for achieving superior spatial resolution. Reasonable electrical and optical properties are required to create functional devices. The capability to deliver these nanostructures on a large scale and in a cost effective way remains a challenging task.

Towards this objective, an alternative implementation is described below in which microsphere near-field focusing is employed for large scale optical nanoprocessing of solution deposited nanoparticles. The microspheres (e.g., 3 µm) are assembled into a regular array and brought parallel to the target substrate utilizing capacitance distance sensing. Each microsphere, serving as a near-field focusing lens, can be addressed individually by spatially modulated illumination. No interference effects due to neighboring microspheres were observed due to the small gap maintained between substrate and microspheres (about a few hundred nm). Nanoparticle sintering is employed to generate conductive structures and ablative material removal to generate negative features. Both processes are in the nanoscale dimensions. Many applications may be pursued in electrical and biological nanoarray technology. For example, nanoscale transistors can be produced at relatively high-throughput. Biological nanostructures can be created by first generating gold or metal-oxide nanostructures and then selectively attaching biomolecules of interest. This technique can also be exploited in the context of patterning large-area plasmonic metallic nanostructures for surface enhanced Raman scattering (SERS) and biomedical sensing. Another area that benefits from this technology is the study of cell adhesion and motility.

B. Experimental Setup

The process illustration and detailed experimental apparatus are shown in FIG. 1. A nanosecond (Q-switched Nd:Yag, New Wave, 532 nm) and a continuous wave (Argon, Lexel, 514 nm) laser are used for nano-ablation and nano-sintering, respectively. The laser beam is directed towards a Digital Micromirror Device (DMD, Texas Instruments, 600×400 pixel) array and the modulated beam is then focused by a 10× long working distance objective lens onto the microsphere array (FIG. 1d).

Figure 2:
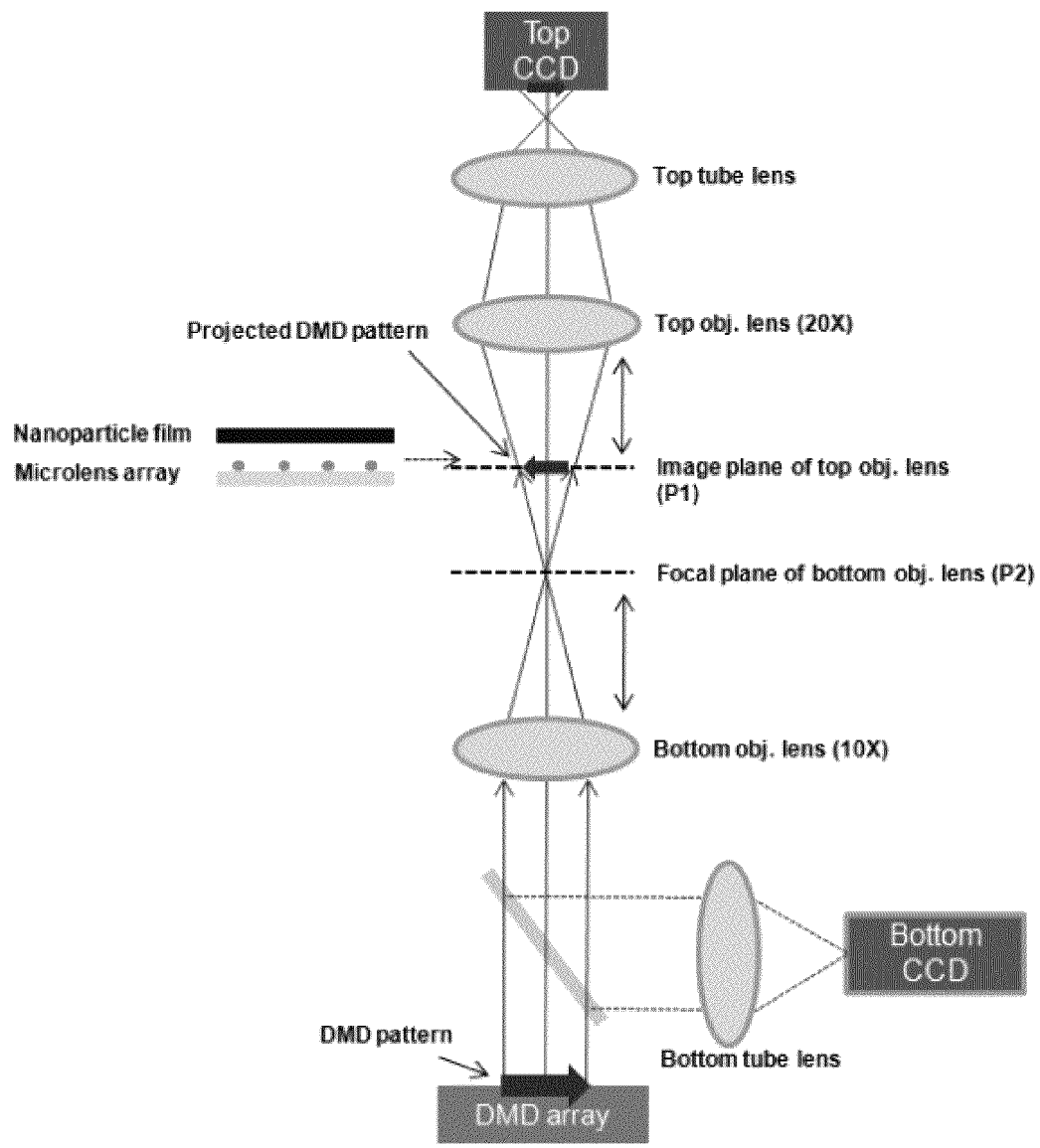
FIG. 2 provides the optical configuration of a system illustrating the alignment of the laser, DMD and microsphere array.

The laser beam, DMD array and the microsphere array are aligned as follows. The laser beam modulated by DMD is guided into the 10× bottom objective lens (FIG. 2). The laser beam needs to be introduced into 10× objective lens vertically. Then a top 20× objective lens, which is aligned coaxially with the 10× objective lens, together with a CCD camera is properly positioned until the projected DMD pattern (shown as red arrow in FIG. 2) can be clearly imaged by the 20× objective lens and the top CCD camera. At this moment, the projected DMD pattern should be placed at the image plane of the top 20× objective lens (P1). If moving either the 20× or the 10× lens along the axial direction (vertically as shown in the figure) does not cause image offset (other than enlarging the image), the laser beam and DMD alignment is considered complete.

After the laser beam alignment, the micro lens array is moved into the image plane of the 20× objective lens (P1) and adjusted until the micro lens array is covered by the projected DMD pattern. The choice of 10× objective lens leads to the projected pattern covering the entire micro lens array if the entire DMD array is illuminated. The DMD array is considered to consist of 800×600 micro mirrors. Assuming 600×600 micro mirrors are projected on the 250 µm×250 µm area and each micro lens is 3 µm×3 µm in area, the number of micro mirrors corresponding to each micro lens is approximately:

$$600 \times 600 \frac{3 \times 3}{250 \times 250} \sim 50$$

The orientation of the micro lens array needs to be adjusted to be perpendicular to the axial direction. This is accomplished by 1) moving the micro lens array to P2, the focal plane of the bottom objective lens, 2) adjusting the tilting stage until four diagonally positioned spots are all in the depth of focus of the bottom 10× objective lens (the bottom CCD camera is used for this purpose).

Two 5-axis translational/tilting stages are used to precisely position the microsphere array slide (processing slide) and the ITO slide (target slide). A PVP (poly-4-vinylphenol, MW-8,000AMU) dielectric layer dissolved in hexanol with a small amount of the cross-linking agent, poly(melamine-co-formaldehyde), was spincoated on the indium tin oxide (ITO) coated slide. The purpose of PVP is to be used as dielectric layer for devices and wetting layer for the ensuing nanoparticle deposition.

1-3 nm sized gold nanoparticle suspensions (nanoinks), encapsulated by hexanethiol self-assembled monolayer (SAM) in organic solvent (alpha-terpineol or toluene) were spin-coated onto the target slide. The gold nanoparticles were synthesized using a two-phase reduction method. Aqueous metal salts ($HAuCl_4$) were mixed in a toluene solution containing long-chain alkylammonium surfactants to form a two-phase system. 1.5 g of tetroactylammonium bromide ($C_{32}H_{68}BrN$) was mixed with 80 mL of toluene and added to 0.31 g of hydrogen tetrachloroaurate (III) hydrate ($HAuCl_4.H_2O$) in 25 mL of deionized (DI) water. Vigorous stirring transferred the metal salt ($AuCl_4$) into the organic phase (toluene) and the aqueous phase was removed. A measured quantity of capping agent, a long-chain thiol (hexanethiol), was added to the gold solution while stirring. Then, a reducing agent, sodium borohydride (NaBH$_4$), mixed in 25 mL of water was added into the organic phase with a fast addition over approximately 10 s to nucleate nano-crystals. The mixture reacted at room temperature for three and a half hours. The toluene was removed with a rotary evaporator and the leftover black particles suspended in ethanol and sonicated briefly. The particles were washed with ethanol and acetone and air dried. The average nano-crystal size was 1 to 3 nm and the size was coarsely tunable by adjusting the ratio of capping groups to metal salt, whereas size selective precipitation was employed to narrow the initial size distribution. In this method, the size distribution of synthesized nanoparticles was controlled by the ratio between metal salt and surface monolayer that additionally prevents the agglomeration of nanoparticles. The size of synthesized nanoparticles was distributed from 1 to 3 nm as measured by TEM. Monolayer-protected gold nanoparticles were suspended in alpha-terpineol with 10% in weight.

SAM controlled the nanoparticle size in addition to enhancing long term stability through Au-thiol chemistry. The solvents used for the nanoparticle suspension were either toluene or alpha-terpineol. Optically uniform nanoparticle films were obtained by adjusting the spin speed and the solvent evaporation. The film optical properties were measured by ellipsometry (Pan, H.; Ko, S. H., Grigoropoulos, C. P., Appl. Phys. Lett. 2008, 93, 234104). The components of the complex refractive index, n, and k were 1.8 and 0.25, respectively, at wavelength of 500 nm and the film thickness was ~100 nm. These were used to quantify the laser light absorption in the nanoparticle film.

Figure 3A:
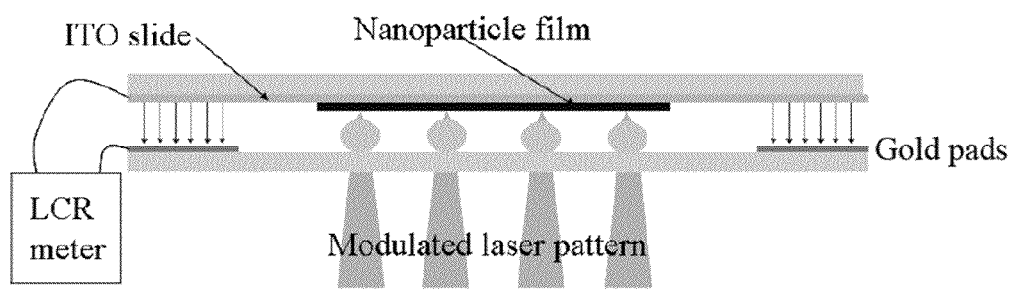
FIGS. 3A and 3B illustrate a protocol for producing a microsphere array.
Figure 3B:
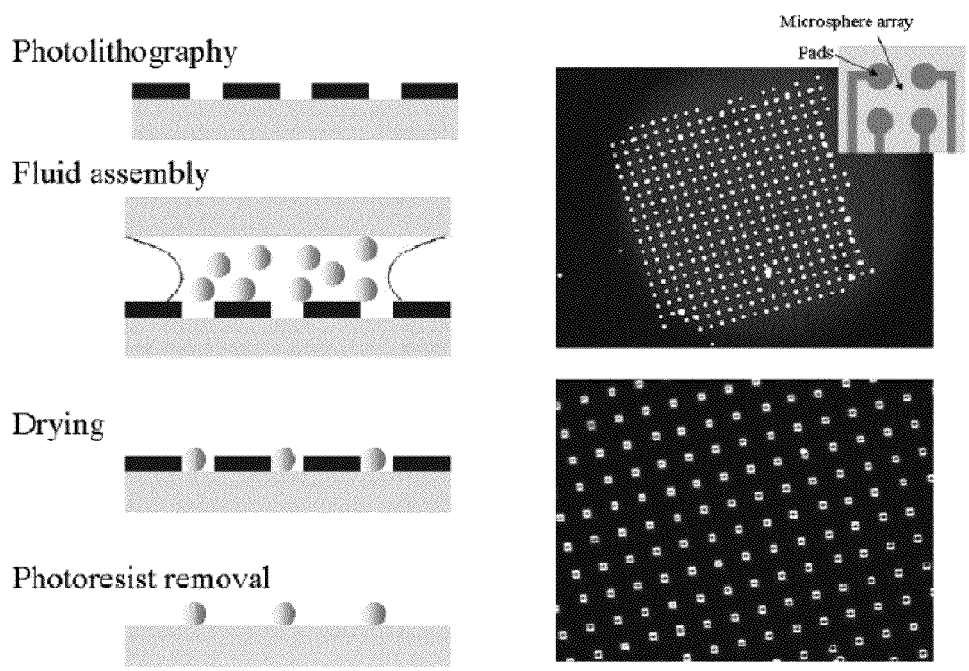

The microsphere array was assembled via a fluidic-assisted process. Specifically, four gold pads (1 mm in diameter) were firstly patterned on Pyrex glass slide by standard lift-off process. These pads were used together with the conductive surface (ITO glass) under the nanoparticle film as electrodes in capacitance measurement for gap control, as illustrated in FIG. 3A. Four pads were positioned as shown in FIG. 3A such that the gap and parallelism between two slides could be easily controlled without inducing crosstalk. After gold pads were defined, photoresist was spun on the glass, followed by a lithography step to define 20×20 holes arrays. The hole-to-hole distance was 13 μm. The entire area of the array was ~250 μm×250 μm. The hole array was positioned at the center of the 4 pads as shown in FIG. 3B. The hole array was used as a template to assemble microspheres. To accomplish this, a cover slide was placed on the glass slide forming a gap of 30 μm controlled by spacers. A drop of microsphere suspension (microspheres of ~3 μm in diameter, Bangs Laboratories, Inc.) was applied at the slide edges. Capillarity action moved the drop into the gap and spread the suspension. After the solution was evaporated, the cover slip was removed and the glass slide was dipped into acetone after a short time annealing on a hot plate. Photoresist was stripped off and a regular array of microspheres was left and ready to be used for laser material processing.

In order to control the gap between processing slide and target slide, a high precision LCR meter (Instek LCR-821) was used to measure the capacitances. Four pads were fabricated lithographically on the processing slide near the microsphere array, as reviewed above. The pads and the target slide (ITO) served as capacitor counter electrodes. The gap between them could then be monitored by capacitance measurement. Parallelism between the processing and target slides was ensured by repeatedly adjusting orientation until four capacitance values were equal. The range of capacitance suitable for laser processing was several pF. Both the top and bottom views during processing could be observed by two CCD cameras.

C. Near Field Laser Beam Characteristics and Gap Control

Figure 4:
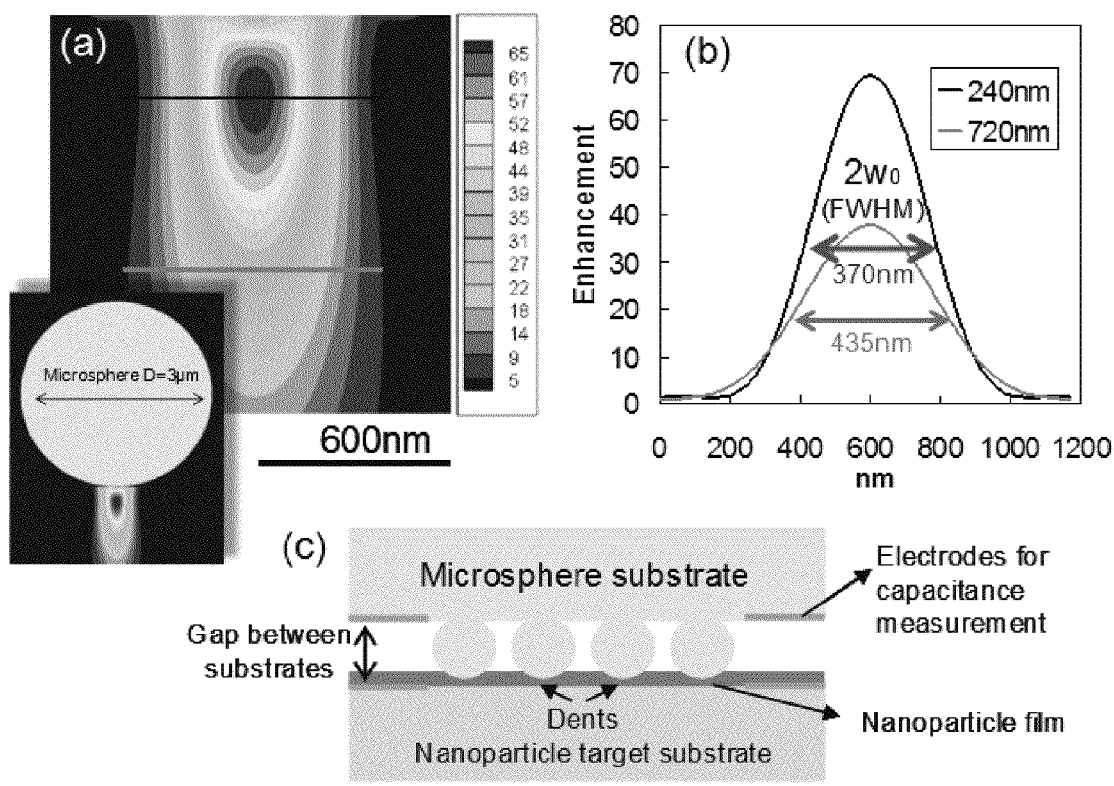
FIGS. 4A-4C.

The beam focusing and normalized intensity distribution underneath the microsphere were calculated by discrete dipole approximation (DDA) (Draine, B. T., P. J. J. Flatau, Opt. Soc. Am. A 1994, 11, 1491) as shown in FIG. 4A, where the refractive index value of 1.45 was used for microsphere. Furthermore, it is also used to estimate the beam diameter and depth of focus. The beam diameter $2w_0$ was defined where the intensity drops to half of the peak intensity at the center (Full Width of Half Maximum—FWHM). FIG. 4B shows that the beam diverged from 370 nm to 435 nm (FWHM) as the measuring plane shifted from the tighter focusing plane (240 nm below the microsphere) to the plane 720 nm below the microsphere. Therefore, the enhancement via the near-field focusing was sensitively affected by the gap between the microsphere and the target planes. Nevertheless, from a practical standpoint this variation was workable.

In view of the steep variation of the focused laser intensity distribution, the gap between the nanoparticle target substrate and the microsphere lens assembly was suitably controlled. The following procedure was adopted to control the gap as illustrated in FIG. 4C. To calibrate the gap distance, the capacitance was measured to be ~6.6 pF when the microspheres touch the nanoparticle target substrate (as evidenced by dents formed on nanoparticle film by the microspheres, FIG. 4C). By neglecting the deformed thickness of the NP film (a fraction of NP film thickness of ~100 nm), the measured capacitance value (~6.6 pF) represented the gap distance between substrates which was approximated by the diameter of the microsphere. By invoking a simple relation between capacitance and gap distance C=const/t, where C is the capacitance and t is the distance, the constant was experimentally found as 19.8 pF·μm. From this relationship, the gap between target and lens array substrates during processing could be estimated. The capacitance used during nano-ablation was ~5.5-6.0 pF, indicating that the nanoparticle film was ~300 nm-600 nm below the microsphere. This distance was left intentionally to provide a pathway for ablated ejecta removal. The capacitance used during nano-sintering was 6.3-6.5 pF leading to closer gap ~100-200 nm. Calibration was needed only once for each distinct sample configuration. For example, if the nanoparticle/PVP/ITO/glass sample was calibrated, the relationship between capacitance and gap distance was obtained. For subsequent processing of the same sample configuration, this relationship can be assumed.

D. Experimental Results and Discussions

1. Nanoablation Results

Figure 5:
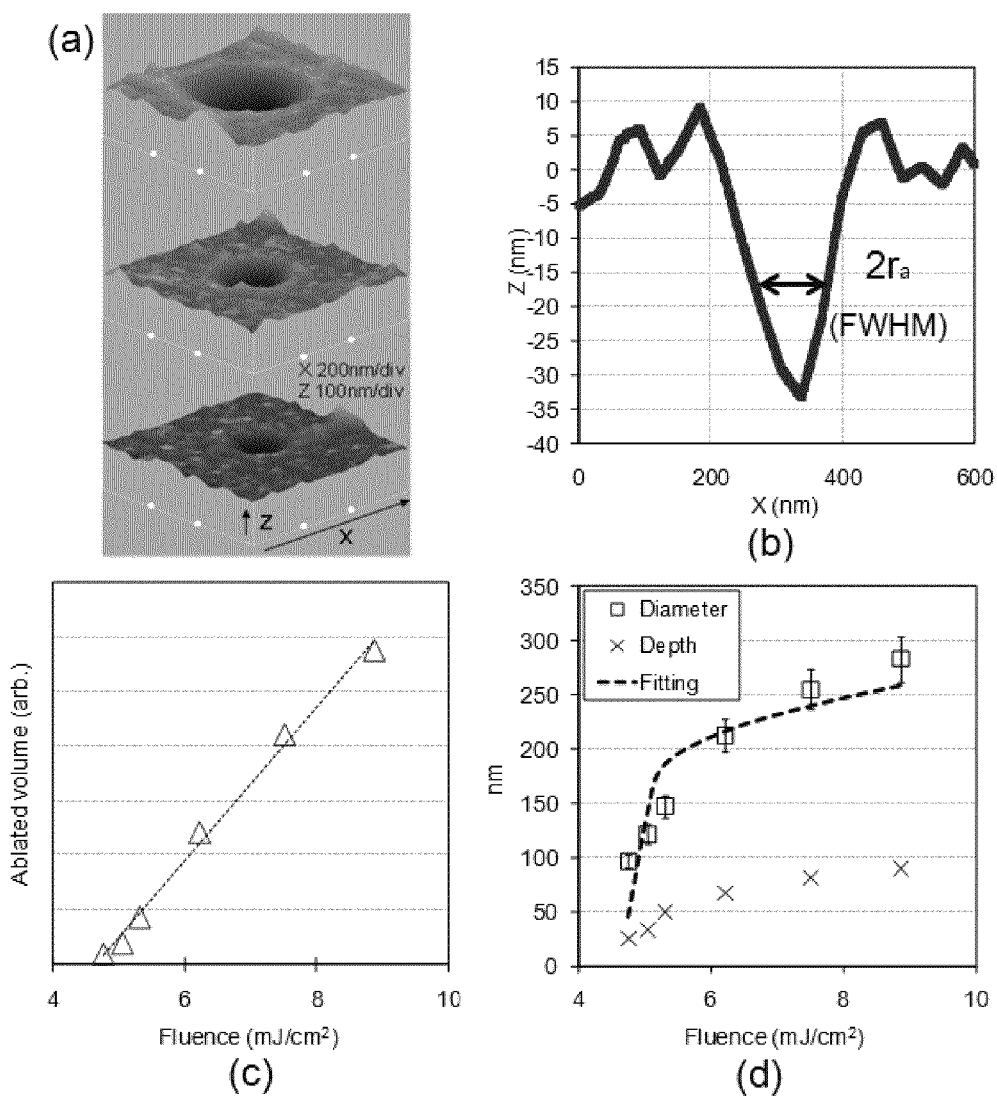
FIG. 5A-5D. Near-field nano-ablation results.

The spin coated nanoparticle was dried sufficiently before ablation to avoid reflow and smearing out of the ablated crater. Depending on the solvent used (toluene or alpha-terpineol), different processes were adopted to dry the spun coated films. Films made by suspensions in toluene were left in the filtered air hood overnight while those dispersed in alpha-terpinoel have 10 min exposure to vacuum to guarantee dryness. FIG. 5 shows nano-ablation results utilizing a single microsphere. Nanosecond laser irradiation with pulse energy 3-10 μJ over beam area ~7e-4 cm$^2$ (sufficient to cover all microspheres), pulse width 3-5 ns, and repetition rate up to 10 Hz was used. The atomic force microscopy (AFM) topography images of the features are shown in FIG. 5A. Negative features with FWHM diameters in the range of ~100 nm to ~300 nm, as shown in FIG. 5B, were generated by varying the incident laser fluence (FIG. 5C). The feature diameter $2r_a$ vs. fluence can be fitted with the following equation (FIG. 5D):

$$r_a = \frac{w_0}{\sqrt{2}} \sqrt{\ln\left(\frac{N \times F_{inc}}{F_A}\right)} \quad (1)$$

where $F_{inc}$ is the incident laser fluence, $F_A$ is the threshold, N is the enhancement at the center of focused beam, and beam diameter is $2w_0$. $F_A/N$ and $w_0$ are used as fitting parameters. The fitting yields $F_A/N \sim 3.8$ mJ/cm$^2$ ($F_A \sim 3.8$ mJ/cm$^2 \times N$) and beam diameter of 400 nm. Recalling the reported threshold fluence $F_A \sim 40$-$80$ mJ/cm$^2$ in far-field laser micro-ablation of similar material (Ko, S. H., Y. Choi, D. Hwang, C. Grigoropoulos, Appl. Phys. Lett. 2006, 89, 141126), N can be estimated to be 10-20. It can be estimated from FIG. 4B that for beam diameter of 400 nm (between 370 nm and 435 nm), the enhancement was ~50, which was substantially lower than the estimated N. Several factors can explain this discrepancy: a) the actual experimental enhancement tends to be lower than theoretical predictions; b) imperfection in the beam alignment; and c) stronger three-dimensional heat diffusion loss in the nanoscale processing compared with the microscale sintering leads to higher FA (Hwang, D. J., Grigoropoulos, C. P., Yoo, J., Russo, R. E., Applied Physics Letters 2006, 89, 254101; Hwang, D. J., Jeon, H. J., Grigoropoulos, C. P., Yoo, J., Russo, R. E., Journal of Applied Physics, 2008, 104, 013110) in nanoscale processing.

The ablated volume plotted vs. laser fluence depicts a linear relation (FIG. 5C). To qualitatively explain this trend and reveal the ablation mechanism, the transient temperature field was calculated. At a fluence of 5 mJ/cm$^2$ the peak temperature can exceed ~2000K after 5 ns according to the simulation. The linear relationship between ablated volume and laser fluence was due to the mixed composition of the film (i.e., Au nanoparticles capped with surfactant layers and leftover solvent between particles). The entire ablation process was thermally driven (temperature increase), although the precise material removal path is still under investigation. Nevertheless, the nanoparticle heating would rapidly increase the temperature of nanoparticle surface capping layer (alkyl-thiol chains). This fast temperature rise may lead to explosive thermal decomposition of the capping layer, as the calculated temperature was well above desorption and evaporation temperature of alkyl-thiols chains under the assumption of well-dried film condition. Depending on the film dryness, rapid phase change in the surrounding solvent by the heat transferred via the particles and the capping layers may boost the ablation process. The phase change contribution was also consistent with our molecular dynamic simulation finding that pure mechanical stress buildup caused by rapid thermal expansion was insufficient to ablate the nanoparticle film (not shown here). It is noted that experimental visualization of unsintered metal nanoparticle film ablation by ns laser pulses focused via a far-field objective lens supports the occurrence of the mechanism that has been referred to by the term "mist jetlike ejection." (Ko, S. H., Pan, H., Hwang, D. J., Ryu, S. G., Chung, J., Grigoropoulos C. P., Poulikakos, D., Journal of Applied Physics 2007, 102, 093102).

Figure 6:
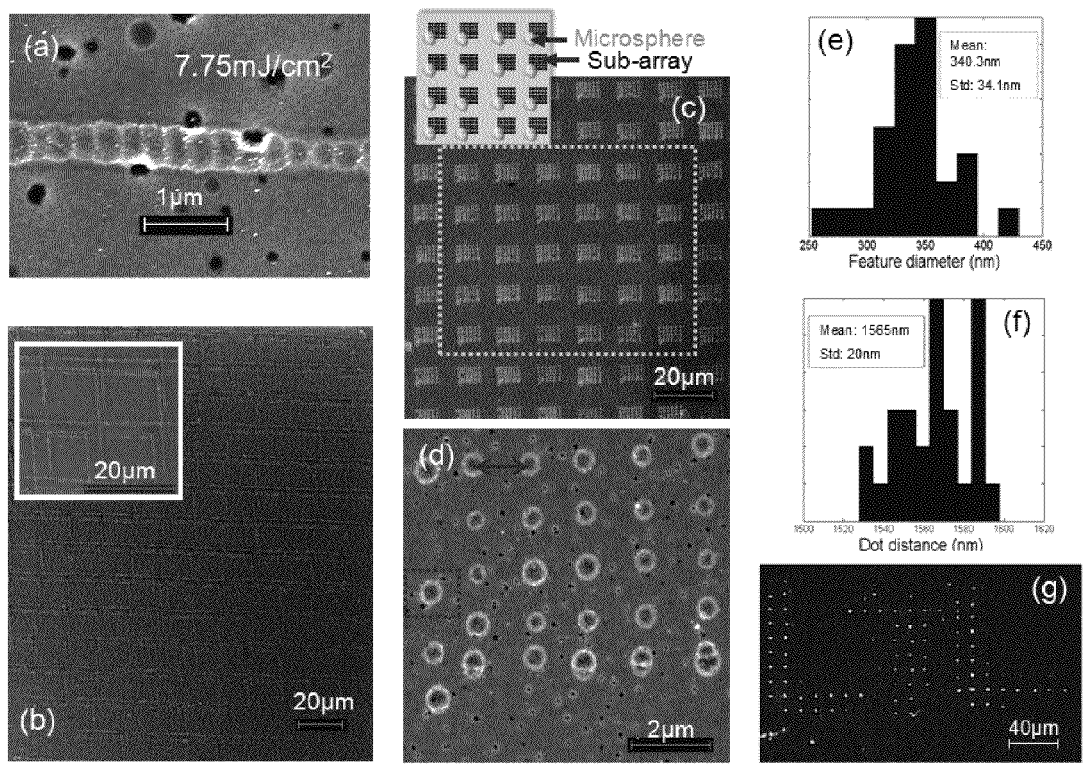
FIG. 6A-6G. High-throughput nano-ablation results. SEM images of (FIG. 6A) single nano-trench, (FIG. 6B) array of nano-trenches by parallel processing, (FIG. 6C) nanoablated dot arrays, (FIG. 6D) one sub-array.

To demonstrate the capability for high-throughput manufacturing, nano-ablated trenches and dot arrays are shown in FIGS. 6A to 6G. The target slide was translated by piezoelectric actuators (1-3 µm/s) to directly make nano-trenches shown in FIGS. 6A-6B. FIG. 6A shows the SEM image of magnified single nano-ablated (7.75 mJ/cm$^2$, 2 µm/s, 10 Hz) trench consisting of consecutive overlapping ablation nanodots. The width of the trench estimated by averaging diameters of the overlapping ablation nanodots was ~425 nm with standard deviation of ~68 nm (16% variation). The generation of nano-trench array by parallel processing is shown in FIG. 6B where the length was limited by piezo actuator traveling range of ~25 µm. Ideally, the maximum translation distance required to fabricate continuous structures was the spacing between the microspheres—13 µm in the present study—which falls within the typical traveling range of most piezo-actuators. An ablation nanodot array was also fabricated through parallel processing (FIGS. 6C and 6D) by intentionally switching on (through control of DMD mirror array) the laser illumination over the entire microspheres for the purpose of checking the process uniformity. The ablation nanodot array consists of parallel fabricated sub-arrays with each sub-array generated by an individual microsphere, as illustrated in FIG. 6C. To generate each sub-array (FIG. 6D) the microspheres were first set to fabricate features by a single laser pulse and subsequently the substrate was translated to a new position. This process was repeated 5×6 times to complete the sub-array. Through parallel processing, all sub-arrays were generated simultaneously. It can be also seen from FIG. 6C that each sub-array can be very well reproduced. The consistent trend in position and ablation size demonstrated suitability for parallel processing of arbitrary features under the current configuration.

To estimate the feature uniformity in parallel processing, 30 sub-arrays were selected for analysis as shown in FIG. 6C. Firstly, one nanodot was picked randomly (e.g., the one highlighted by the rectangle in FIG. 6D) within the sub-array. The diameters were measured from SEM images (FIG. 6D) for corresponding ablation nanodots located at the same position within each sub-array. The size distribution based on 30 ablation nanodot sub-arrays is plotted in FIG. 6E, indicating that the variation was around 10% of the mean diameter. Secondly, the relative position between two ablation nanodots (FIG. 6D, center-to-center distance indicated by arrow) within the sub-arrays was measured and similar statistics were obtained for 30 sub-arrays. The respective distribution is shown in FIG. 6F and very small variation was found. However, it should be noted that within each sub-array the placement of ablation dots becomes less accurate (FIG. 6D) due to the open loop piezo scanner. This can be improved by implementing a closed loop piezo. The ablation dot size variation within sub-array was determined to be ~15%, and was mainly due to the pulse-to-pulse fluctuation of the ns laser. The same reasoning applies to the observed non-uniformity in nano-trenches (16%). Both can be remedied by using a more stable laser or multiple pulses to smooth out fluctuations by averaging.

While nanoprocessing by self-assembled microsphere monolayers has been limited to fixed and regular hexagonally-close-packed nanodot patterns, a significant contribution of the current work is the fabrication of arbitrary two-dimensional patterns through (1) orthogonal arrangement of the microsphere array, (2) capability to address the individual pixels since arbitrary parallel near-field processing could be realized by projecting patterns modulated by the DMD (FIG. 6G highlights these aspects by demonstrating an example of the nano-ablated nanodots forming 'LTL' shaped pattern), and (3) piezo scanning capability to precisely draw nanopatterns over the space unoccupied by the microspheres. By loading a series of images via the DMD mirror array, and synchronizing with the piezo scanner, a truly arbitrary nano-patterning workbench with great flexibility for multiple scale processing (by simply choosing different light confining elements depending on the target feature resolution) was accomplished.

It is pointed out that the demonstrated ablative nanomachining could be challenging via the current configuration in terms of stable processing due to possible trapping of ablated material within the tight spacing formed between the two parallel plates and contamination of the microsphere surface. The achieved "stable ablation regime" possibly represents a "dynamic balance" between deposition of ablated material on the microsphere surface that was subsequently cleaned by the incident processing nanosecond laser beam (this is essentially a laser cleaning process). It has been shown (Hwang, 2006, supra; Hwang, 2008, supra) that ejecta from micron or sub-micron ablation craters produced by near-field laser irradiation (where the gap distance between sharp tip and ablative material source is ~10 nm) expand in 3D and around the sharp tip. This characteristic is favorable in terms of alleviating probe (microsphere) contamination issues. Implementation of micromachined channels in the proximity of the microsphere may be particularly helpful for long-term stability. Furthermore, it enables a laser CVD process (Denk, R., Piglmayer, K., Bäuerle, D., Applied Physics A-Materials Science & Processing, 2003, 76(4), 549; Denk, R., Piglmayer, K., Bäuerle, D., Applied Physics A 2002, 74, 825.) via efficient gas delivery for processing. The consistent ablation results proved that the current configuration was effective for non-ablative applications where the constraints in terms of applied laser energy densities and debris removal were substantially less severe.

2. Nanosintering Results

Figure 7:
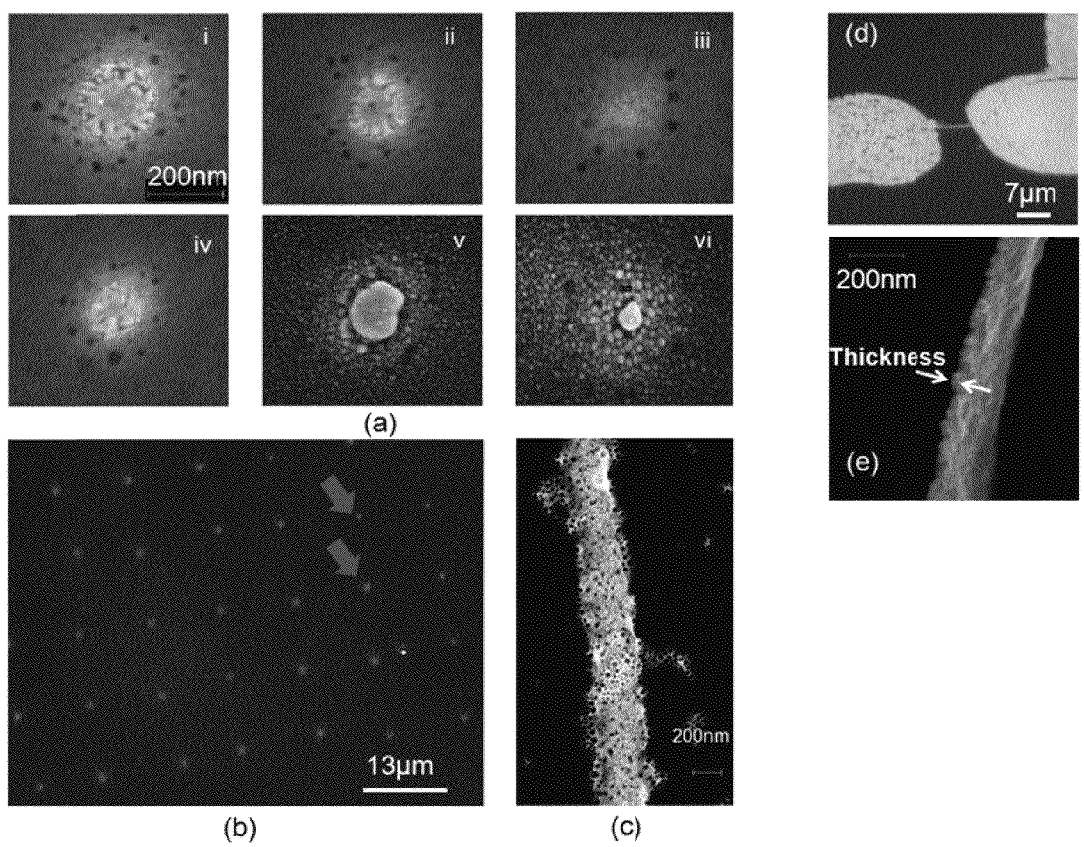
FIGS. 7A-7F. Near-field nano-sintering results.

Nano-sintering was conducted with microspheres placed closer to the substrate (~100-200 nm underneath the microspheres, corresponding to capacitance of 6.3-6.5 pF). A closer gap was intended to enhance the laser intensity. A CW Argon laser with power 100 mW-230 mW was used. The maximum power was limited by the argon laser used and also the power loss after the DMD (where only the zeroth order diffraction from the micro-mirror array can be collected). Due to the limitation in the laser power available for this experiment and in order to maintain sufficient power intensity, the laser beam diameter was only ~100 μm covering up to ¼ of the microsphere array. The result of using averaged incident intensity of ~1.9e7 W/m$^2$ (the intensity is the value before focusing by microsphere) is discussed below. The spin-coated nanoparticle film of ~100 nm thickness (measured by ellipsometry) was left overnight to dry out the solvent (toluene) before nano-sintering. The nano-sintering results are shown in FIGS. 7A-7F. FIG. 7A shows SEM images of sintered dots. It can be observed that due to the Gaussian laser intensity distribution, the sintering initiated at the center and propagated outwards (FIG. 7A(i-iii)). The sintering yielded a dense solid metal sintered dot at the center and looser structure surrounding the sintered dot. The thiol protecting layers were desorbed from the gold nanoparticles whose surface was then exposed allowing the subsequent sintering. The sintered dot size increased with time and ~200 nm (~150 nm with lower energy, FIG. 7A(iv)) diameter gold dots were obtained after 5 s sintering. After sintering, the sample was dipped in toluene to wash away un-sintered nanoparticles. Negligible residual nanoparticles were found after washing. A furnace annealing step at 400° C. caused densification and beading that reduced the sintered dot size down to 50 nm in diameter (FIG. 7A(vi)). The array of sintered dots is shown in FIG. 7B. The observed large size variation was mainly due to the small spot size of the incident laser beam (covering only ¼ of the microsphere array). The power density variation within the beam was evident via the non-uniformity in the sintered dot sizes. To improve uniformity, higher power laser enabling larger area illumination may be used.

Compared to the laser intensity employed in previously reported micro-sintering studies (3e7 W/m$^2$ and 1e8 W/m$^2$) (Ko, S. H., H. Pan, C. P. Grigoropoulos, C. K. Luscombe, J. M. J. Fréchet, D. Poulikakos, Nanotechnology 2007, 18, 345202; Chung, J., Ko, S., Bieri, N. R., Grigoropoulos, C., and Poulikakos, D., Appl. Phys. Lett. 2004, 84(5), 801-803), the subject microsphere required input intensity lower by 1.5-5 times in order to induce nano-sintering. This was in accordance to the observed weaker enhancement in the previously discussed nano-ablation experiments. It should be noted the three-dimensional heat transfer loss would be higher in the case of sintering compared with the ablation due to the longer processing time required.

Conductive nanolines (e.g., nanowires) were fabricated by translating the substrate while maintaining the gap. A typical sintered nanoline is shown in FIG. 7C. Good line width uniformity was observed despite the roughness and porosity induced by the sintering process. To measure the resistivity of the fabricated nanoline, micropads were sintered by a far-field lens focused laser to provide electrical contacts bridging the sintered nanoline as shown in FIG. 7D. The measured resistivity was ~10-15 times higher than bulk gold (FIG. 7F). The high resistivity was most likely due to porosity, presence of grain boundaries and contamination from solvents and surfactants on the laser sintered nanostructures as well as nanostructure confinement effects.

3. OFET Device Fabricated by Nanosintering

Figure 8:
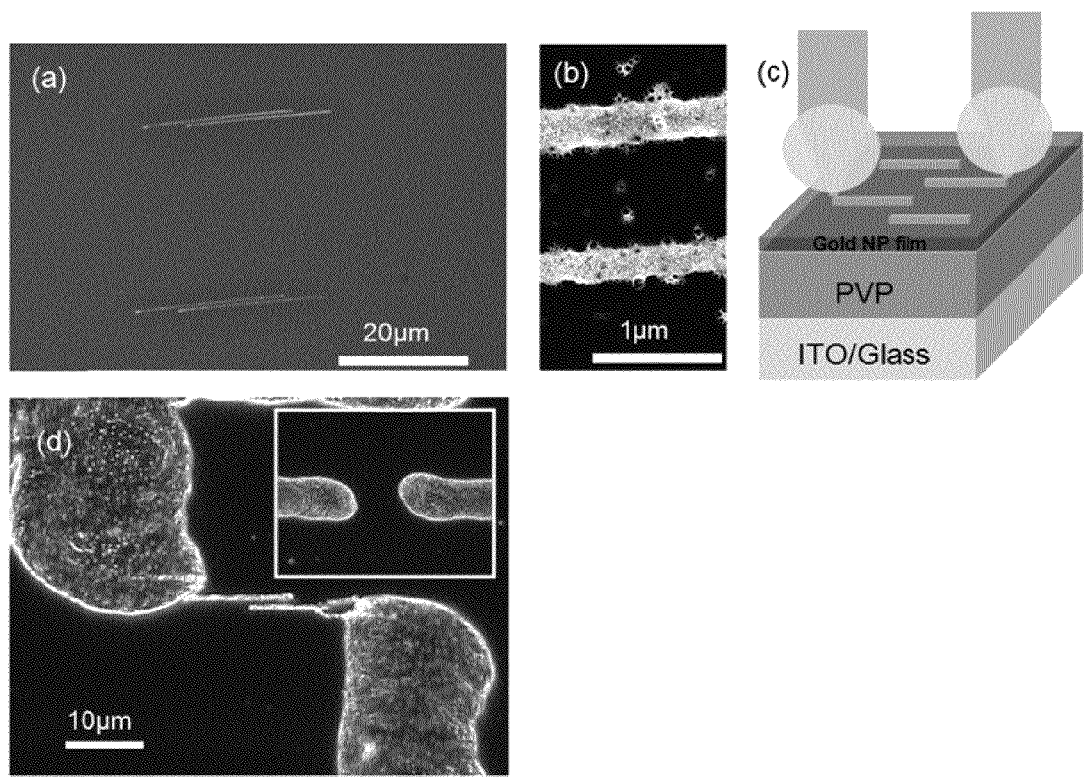
FIGS. 8A-8E. Nano-sintered OFET with air-stable semiconducting polymer.

Direct writing (sintering) of pairs of closely spaced nanowires was demonstrated by precisely controlling the piezo-stage movement with synchronized laser illumination via the DMD mirror array. FIGS. 8A-8B show sintered nanolines having width of ~250 nm and spaced ~800 nm apart. The gap could be further reduced upon more tuning of the system stability. A pair of nanowires was used as electrodes for organic field effect transistors (OFET). The ITO substrate was used as the gate electrode, whereas spin-coated PVP served as dielectric layer (FIG. 8C). After generating the nanoline electrodes, Au contact pads were directly written by a micron size focused laser sintering step. The device structure is shown in FIG. 8D. The active layer bridging the gap was a spin-coated at 3000 rpm air stable semiconductor polymer (Murphy, A. R.; Liu, J.; Luscombe, C.; Kavulak, D.; Frechet, J. M. J.; Kline, R. J.; McGehee, M. D. Chem. Mater. 2005, 17, 4892-4899). The air-stable semiconducting polymer was a novel material of a modified polythiophene containing electron-withdrawing alkyl carboxylate substituents (Murphy, supra).

The polymer was synthesized as follows. All chemicals were purchased from commercial sources and used without further purification unless otherwise stated. The synthetic scheme for the air stable semiconductor is shown in Scheme 1.

Scheme 1. Air Stable Semiconducting Polymer Synthesis

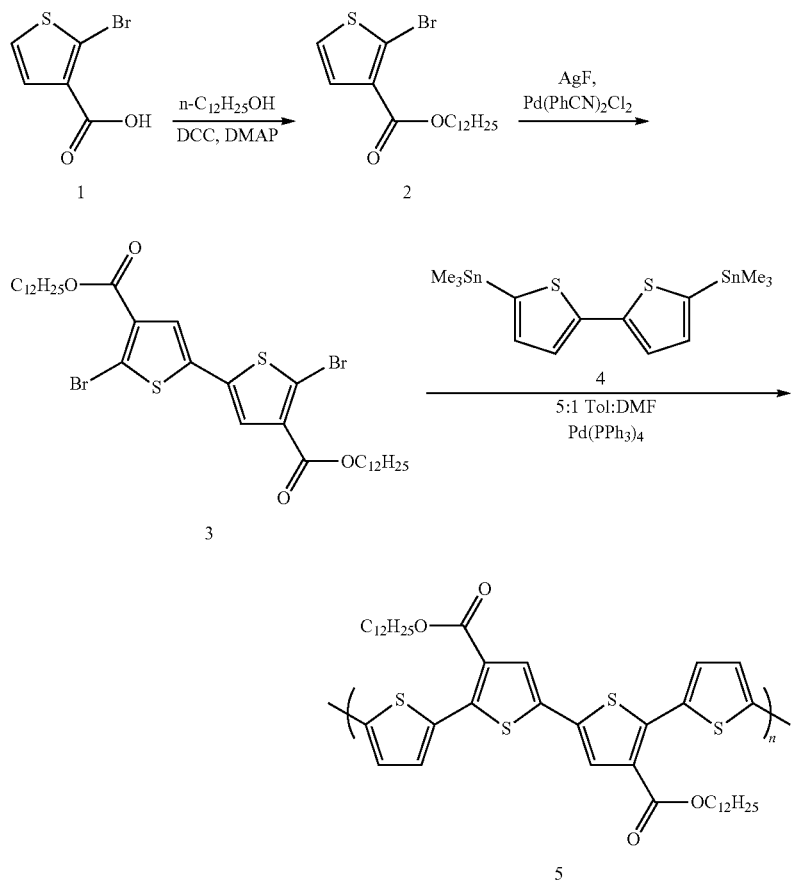

5,5'-bis(trimethylstannyl)-2,2'-bithiophene 4 (Fong, H. H.; Pozdin, V. A.; Amassian, A.; Malliaras, G. G.; Smilgies, D. M.; He, M. Q.; Gasper, S.; Zhang, F.; Sorensen, M. J. Am. Chem. Soc. 2008, 130(40), 13202-13203) and 2-bromothiophene-3-carboxylic 1 acid (Pomerantz, M.; Amarasekara, A. S.; Dias, H. V. R. J. Org. Chem. 2002, 67(20), 6931-6937) were prepared as described in the literature. Tetrahydrofuran (THF), N,N-dimethylformamide (DMF), and toluene were dried by passing through neutral alumina prior to use. All small molecules were characterized by $^1$H NMR (400 MHz) and $^{13}$C NMR (100 MHz) on a Bruker AVB 400 or AVQ 400. Polymer $^1$H NMR (500 MHz) spectra were obtained on a Bruker DRX 500. All NMR spectra were referenced to TMS. High-resolution mass spectroscopy and elemental analysis (CHN) were performed at the University of California, Berkeley Department of Chemistry analytical services laboratory. Column chromatography was performed with silica (230×400 mesh). Polymer molecular weights were determined by size exclusion chromatography (SEC) using THF as the mobile phase. SEC with THF mobile phase (1 mL/min, 45° C.) was carried out using a Waters GPC 150-CV plus system (Milford, Mass.) with an attached M486 tunable absorbance detector (254 nm), calibrated with polystyrene standards.

Dodecyl 2-bromothiophene-3-carboxylate (2) was synthesized as follows. 2-bromothiophene-3-carboxylic acid (1) (1.0 eq, 2.4 mmol, 0.50 g) and 1-dodecanol (1.1 eq, 2.7 mmol, 0.50 g) were dissolved in 5 mL anhydrous THF. In a separate flask, N,N'-dicyclohexylcarbodiimide (1.0 eq, 2.4 mmol, 0.49 g) and 4-(dimethylamino)pyridine (100 mg) were dissolved in 10 mL anhydrous THF. This solution was transferred to the thiophene solution via cannula, and the reaction heated to reflux for 24 h. The reaction was then allowed to cool to room temperature and filtered. The solid was washed with THF, and solvent was removed from the filtrate under reduced pressure. The crude reaction mixture was purified by column chromatography (10% ethyl acetate in hexanes/silica) to yield 0.80 g (89% yield) of the desired product as a clear oil. Didodecyl 5,5'-dibromo-2,2'-bithiophene-4,4'-dicarboxylate (3) was prepared as described in the literature (Murphy, supra). Poly(didodecyl 2,2'-bithiophene-4,4'-dicarboxylate-co-2,2'-bithiophene) (5) was prepared as described in the literature (Murphy, supra).

The carboxylate-functionalized polythiophene was dissolved in warm (>45° C.) 1,2-dichlorobenzene solvent (3 mg/mL) before spin coating. For comparison, a pair of contact pads without nanoline electrode was also fabricated by focused laser writing (inset of FIG. 8D). The device was annealed for 10 mins before electrical testing. Under different gate voltages, a clear field effect was observed where the drain-source current ($I_{ds}$) increased with increasing gate voltage ($V_g$). The field effect was most likely due to the submicron gap across the nanoline electrodes. To confirm that, I-V measurement was performed on the laser sintered micropads without nanolines. The current in this case was substantially lower (FIG. 8E). The I-V curve did not show saturation due to the short channel effects, while saturation is observed in contact pads without nanolines. More rigorous studies on device performance uniformity are under way by using pre-patterned microscale electrode pairs.

E. Conclusion

To summarize, a parallel near-field optical nanomanufacturing scheme that is suitable for high-throughput fabrication of nanostructures is provided. Fluidically assembled microsphere arrays with predetermined pitch were used as micro lenses. By incorporating a digital micro mirror array for the laser beam modulation, each microsphere can be illuminated independently, resulting in pixel addressable tools. Arbitrary patterns of functional nanostructures were generated by direct processing of solution deposited gold nanoparticles using the lens array. This method is useful for fabricating extensive arrays of nanostructures of various materials, including semiconductors. One of the advantages is that the entire process is performed in ambient environment, involving only solution-processed materials.

In the current setup, a total 20×20 microlenses were employed, corresponding to a maximum yield of 400 features per laser processing step. For ablation, all microlenses can be illuminated under sufficient energy density. For sintering, due to the limited power offered by the Argon laser, only ¼ of the micro lenses can be illuminated, yielding ~100 features per processing. Extension to larger area processing is feasible with higher power laser, opening the way to a new high-yield nanomanufacturing with remarkably low cost. Furthermore, it is recalled that the authors have demonstrated various nano-processing examples on nanoscale laser-assisted ablation, chemical etching, CVD, and melt-mediated surface modification (Denk, R., Piglmayer, K., Baüerle, D., Applied Physics A-Materials Science & Processing, 2003, 76(4), 549; Denk, R., Piglmayer, K., Baüerle, D., Applied Physics A 2002, 74, 825; Brodoceanu, D., Landstrom, L., Baüerle, D., Applied Physics A-Materials Science & Processing, 2007, 86(3), 313-314; Langer, G., Brodoceanu, D., Baüerle, D., Applied Physics Letters, 2006, 89(26), 261104; Wysocki, G., Denk, R., Piglmayer, K., Arnold, N., Baüerle, D., Applied Physics Letters 2004, 82(5), 692) using various laser systems (from CW to fs laser) on different test materials. Additional improvement based on regular hexagonal microsphere array can be achieved in the context of the work presented herein, i.e. programmable and scanning based capabilities. Such progress will realize a practical and flexible, multi-scale and multi-task nanoprocessing workbench.

II. Alternative Near-Field Focusing Array Mediated Nanostructure Production

A. Introduction

Three different alternative near-field focusing array configurations were evaluated for their use in producing nanostructures from a target film. The three different near-field focusing arrays were a micro-aperture array, a micro-lens array and a microprojection array. These different near-field focusing array configurations and their evaluation are now described in greater detail.

B. System Configuration

Figure 9:
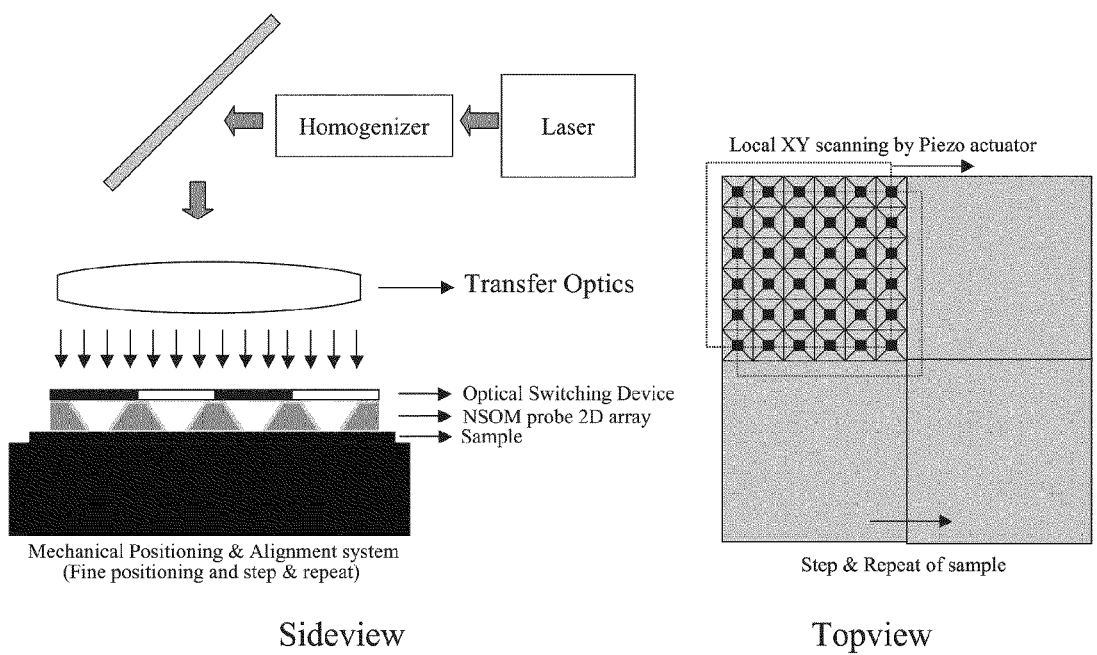
FIG. 9: Schematic diagram of a high throughput nanopatterning system according to an embodiment of the invention.

As the near-field scanning optical microscope (NSOM) aperture size is reduced, the transmission efficiency drops by orders of magnitude. To overcome this, micromachined NSOM apertures and focusing elements (microlenses or blunt tips) were designed, fabricated and tested, as described below. Another key issue was the scalability and throughput of the process. In response to these needs, the aperture/blunt tip optical head array concept has been developed. FIG. 9 presents a schematic of this approach.

The high-repetition rate, pulsed laser beam was homogenized in order to reduce fluctuations of the intensity and was directed through transfer optics maintaining a reasonable depth of focus onto an array of optical switching devices (e.g., liquid crystals) that allow time-controlled passage to the micromachined aperture array. The sample specimen was mounted on a precision translation stage that was positioned by fast actuator motors. A step and repeat process was implemented as desired for the processing of multiple areas. The system depicted in the diagram of FIG. 1 summarizes the overall system and demonstrates a scalable, maskless and reconfigurable, high-throughput nanopatterning configuration.

C. Design of Alternative Near-Field Focusing Arrays

Optimal combination of the aperture geometry, thickness and layout of material films is sought by computing the near-field intensity distribution emitted by the NSOM elements. This can be done utilizing the finite-difference time-domain (FDTD) technique. FDTD techniques involve solutions of Maxwell's equations through an approximation of both the temporal and spatial derivatives with finite-difference forms. Below are examples of such calculations for both silicon apertures and blunt glass heads using the TEMPEST 6.0 EM solver package that has been developed in U.C. Berkeley (Pistor, T. V., 2001, Electromagnetic Simulation and Modeling with Applications in Lithography, Memorandum No. UCB/ERL M01/19).

Figure 10A:
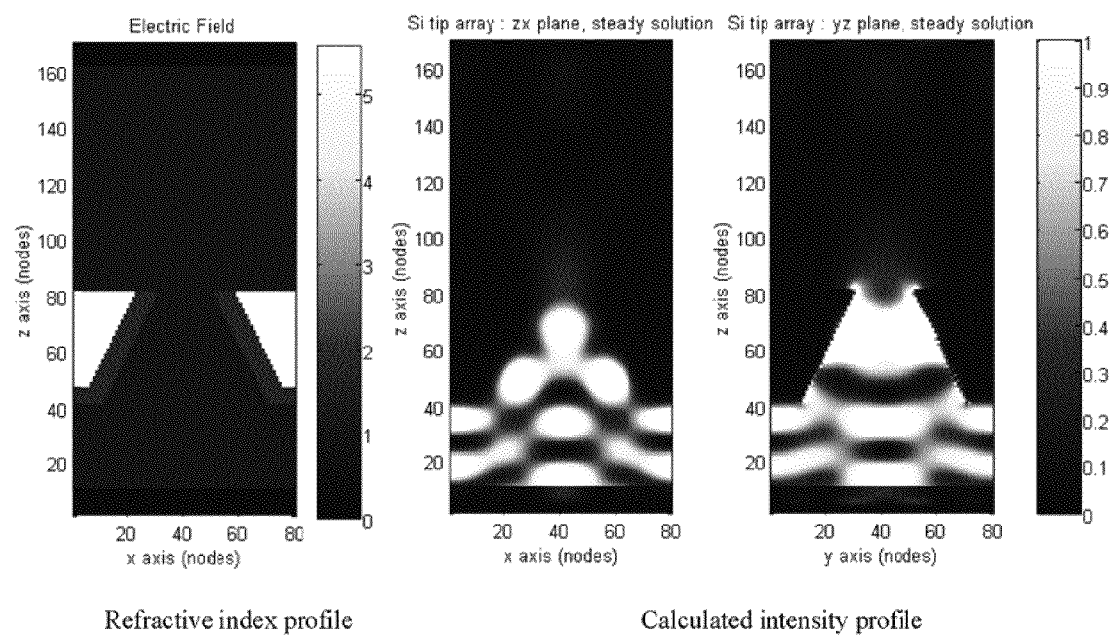
FIGS. 10A-10B: Simulations of light propagation through NSOM microapertures micromachined in crystalline silicon. The top panels give a map of the intensity distribution in the z-x plane, while the bottom panel curves give the cross-sectional distributions on the x-y and y-z planes at different distances from the aperture bottom plane.
Figure 10B:
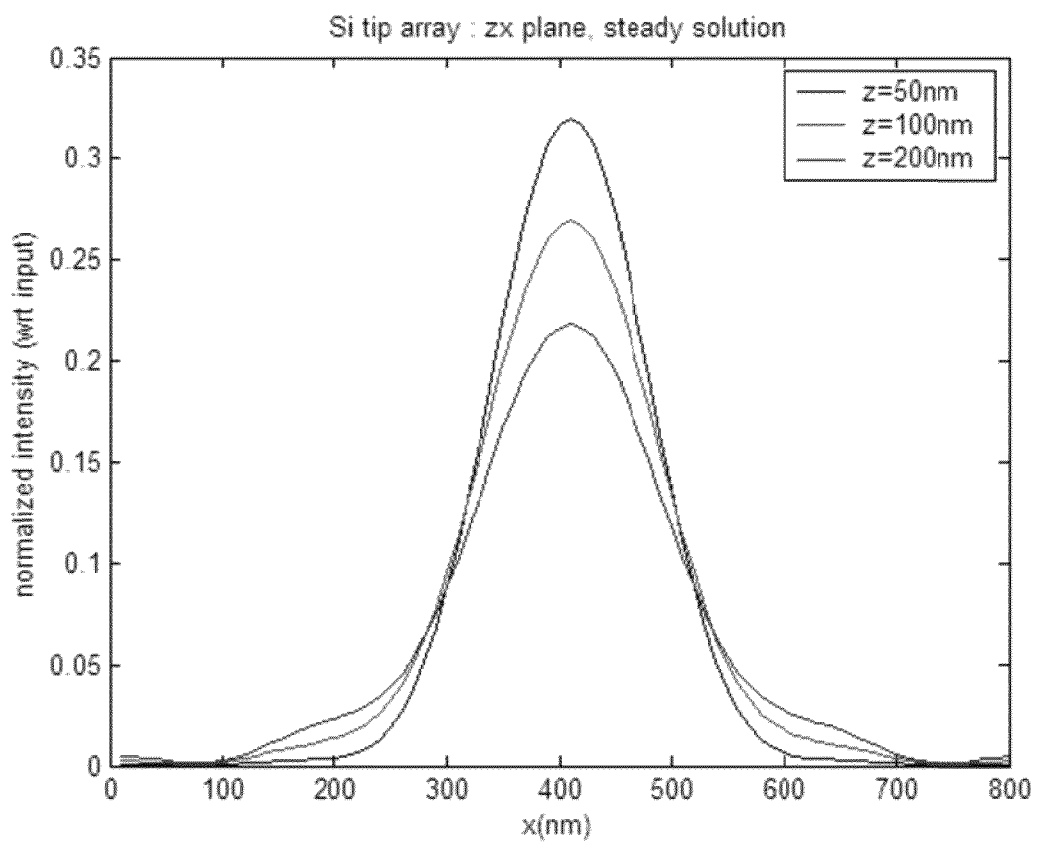
Figure 11A:
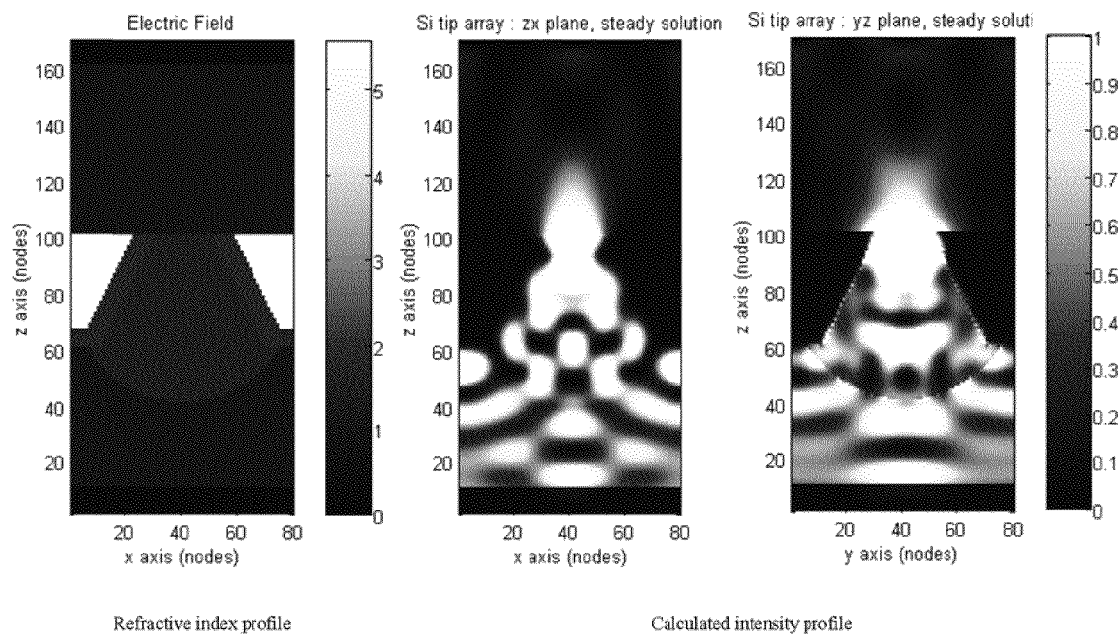
FIGS. 11A-11B: Simulations of light propagation through NSOM apertures micromachined in crystalline silicon and fitted with focusing microlenses. The top panels give a map of the intensity distribution in the z-x plane, while the bottom panel curves give the cross-sectional distributions on the x-y and y-z planes at different distances from the aperture bottom plane.
Figure 11B:
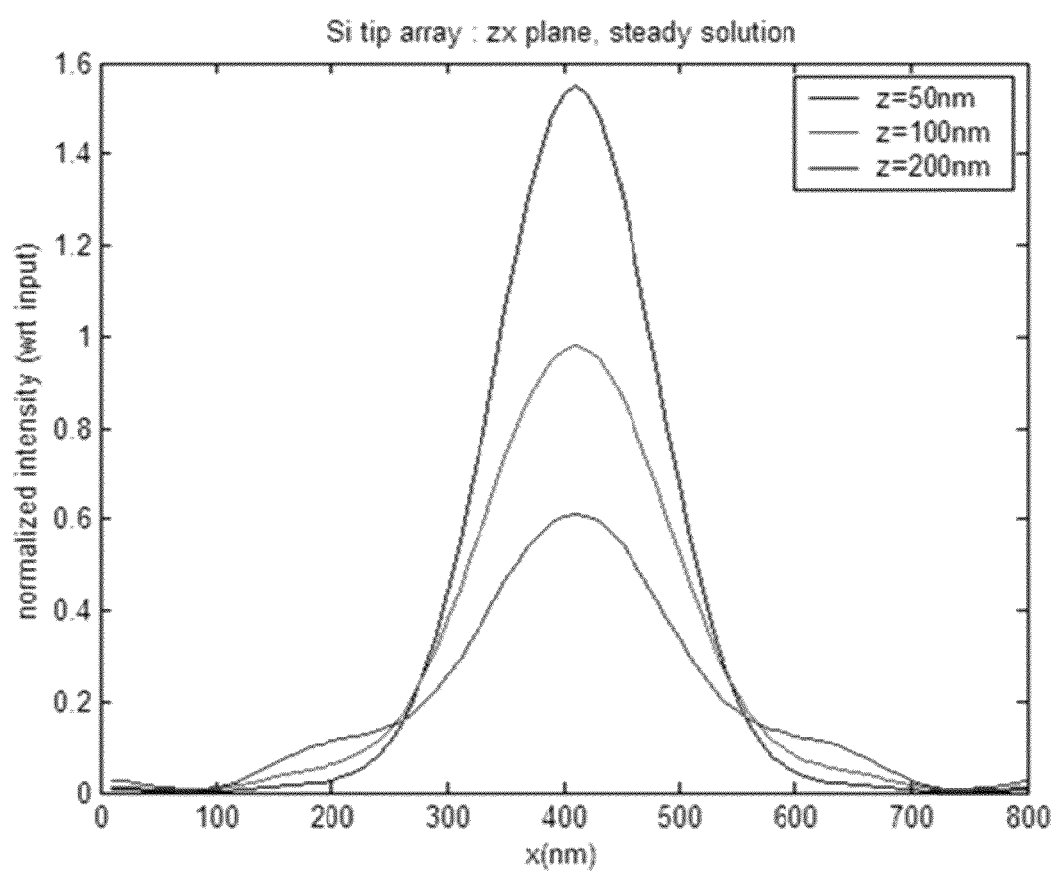
Figure 12A:
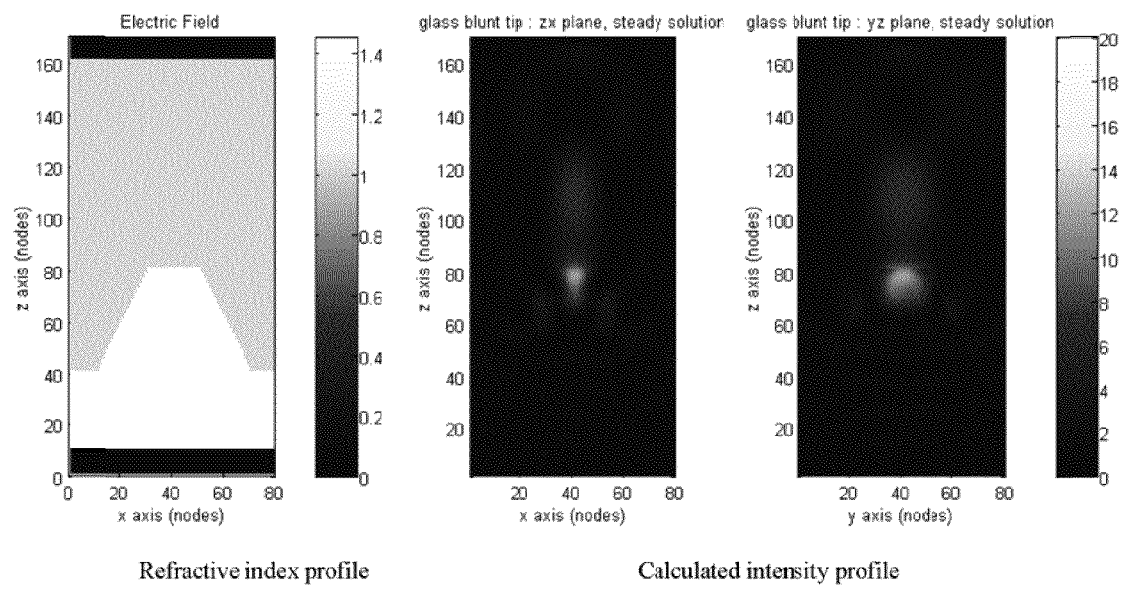
FIGS. 12A-12B: Simulations of light propagation through glass NSOM blunt tips. The top panels give a map of the intensity distribution in the z-x plane, while the bottom panel curves give the cross-sectional distributions on the x-y and y-z planes at different distances from the blunt tip bottom surface.
Figure 12B:
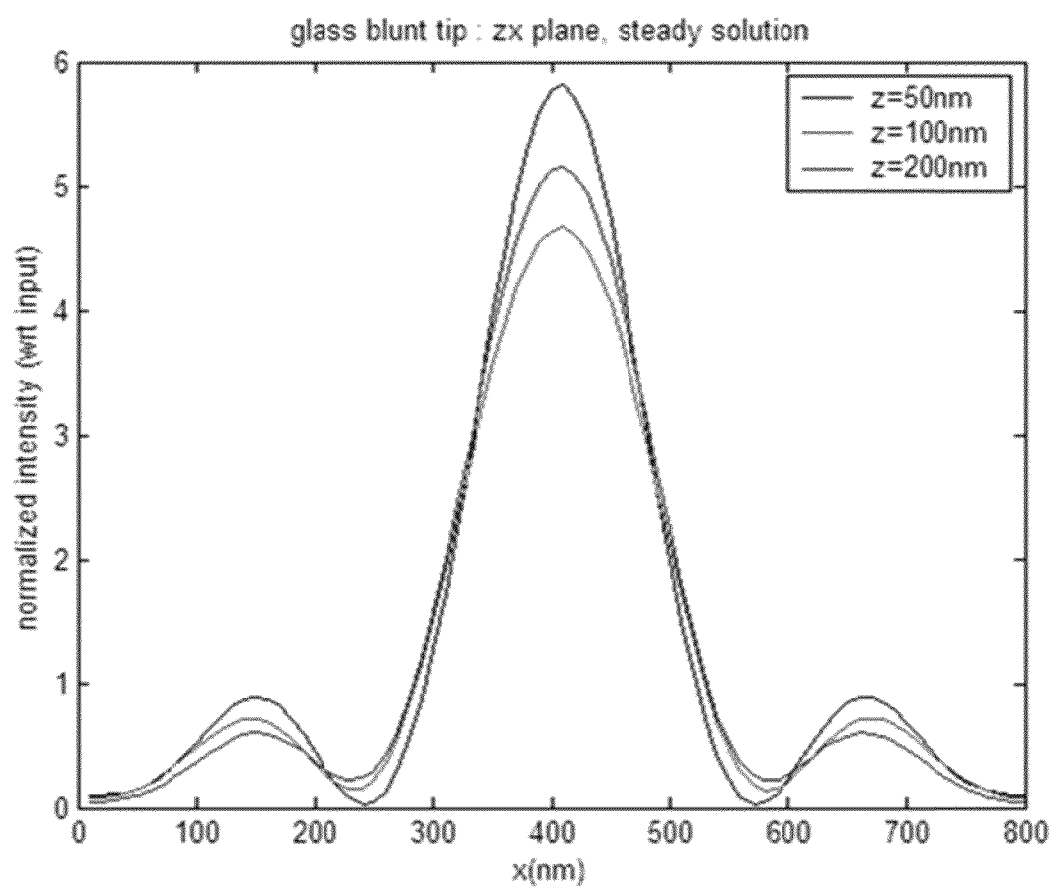

The results shown in FIG. 10 show effective transmission of light at 400 nm wavelength through a 200 nm aperture micromachined in silicon and coated by an Au/Cr bi-layer. By designing the aperture geometry, it will be sought to decrease the aperture size and at the same time eliminate the lateral perturbations of the intensity profile that are displayed in the y-z plane cross-section. An improvement is noticed in FIG. 11 if the apertures are fitted with focusing microlenses. In this case, the y-z plane perturbations are relaxed and an increase in transmission to an enhanced intensity ratio of ~1.6 is observed. Furthermore, the simulation results of FIG. 12 show excellent characteristics for the same wavelength through glass blunt tips of 200 nm base diameter. Indeed, the enhancement of the laser beam intensity reaches a factor of 6, while the cross-sectional intensity profiles are exceptionally smooth and spatially confined in both directions. Another significant advantage is the relatively weak dependence of the intensity profile on the distance from the tip. This has great practical implications, since it relaxes the requirement of extremely close proximity with the tip, while it also indicates that the tolerance of the tip/sample gap does not need to exceed 10 nm for exceptional nanopatterning results.

The confinement of the laser beam scales with the aperture and has a full-width-half-maximum (FWHM) of about 200 nm. The ultimate nanomachining feature resolution will be lower by a factor of 2, since the phase transformations involved usually exhibit a threshold behavior. It should be mentioned that while the above results are described, they do not represent by any means the limits of the proposed approach. Instead, they are examples of structures that can be fabricated in a relatively straightforward manner, i.e., without challenging current electronics microfabrication technology. In certain embodiments, nanomachined apertures with a feature resolution of 10 nm may be designed and fabricated. The following section describes the technical approach.

D. Microfabrication of the Arrays

FIG. 13 shows in more detail the elements of the near field focusing arrays (i.e., NSOM probe arrays) that includes three configurations. First, the fabrication of the silicon aperture array begins with anisotropic etch of a c-Si wafer, followed by deposition of a dual Au/Cr thin film layer. The nanoscale aperture is defined by focused ion beam (FIB) milling. Second, a variance of this probe array is fabricated by constructing microlenses via deposition and reflow of a photoresistive polymer or $SiO_2$ material. This arrangement enhances the coupling of the laser beam radiation to the NSOM aperture array. The third configuration has multiple projections (in this case blunt tips) fabricated via isotropic etch of quartz (fused silica) wafers. The number of microprobe elements (apertures or blunt tips) per processing head is defined by the constraints of the entire optical head movement over the sample.

E. Nanoscale Surface Modification Experiments

The performance of the above described near-field focusing arrays and their microprobe components was evaluated by conducting various processing experiments on a variety of materials, including metals, semiconductors, glass surfaces and polymers. Depending upon the material characteristics, composition and structure, different mechanisms are responsible for the surface modification.

1. Topography Change through Melting and Freezing

Nanoscale surface modification were studied via both ablative material removal and material redistribution utilizing the above near-field processing schemes. In the low pulse energy regime, the process involves simple expansion and contraction without permanent modification or any significant morphology change. At higher fluences, the material melts. The surface of the melt is then subjected to both thermocapillary as well as concentration-driven surface tension forces that induce shear stresses on the surface. While thermocapillary forces normally act in the radial outward direction, chemicapillary forces tend to pull the material inward, creating a bump (Chen, S. C., Cahill, D. G., and Grigoropoulos, C. P., 2000, "Melting and Surface Deformation in Pulsed Laser Surface Micro-modification of NiP Disks," Journal of Heat Transfer, Vol. 122, pp. 107-112; Schwarz-Selinger, Th., Cahill, D. G., Chen, S. C., Moon, S.-J., and Grigoropoulos, C. P., 2001, "Micron-Scale Modifications of Si Surface Morphology by Pulsed-Laser Texturing," Physical Review B, Vol. 64, p. 155323). Near field processing imparts extremely tight distributions on the surface and thus extremely steep thermal gradients. Experiments are conducted to quantify the heat and mass transfer and the resulting nanoscale surface topography. Furthermore, extremely localized melting, resolidification, recrystallization and dopant redistribution in semiconductor materials (Si, GaAs) is performed. With the proper selection of the experimental parameters, the target domain size is confined to about 10 nm.

2. Topography Modification in Glassy Materials

Earlier work has shown that permanent structural change in glass is induced by a higher glass transition temperature due to the fast cooling process upon nanosecond pulsed laser heating. Accordingly, microsecond-long $CO_2$ laser pulses resulted in net volumetric gain, manifested by a positive protrusion of maximum height having a logarithmic dependence on the pulse energy. Work by Zhao and Bennett (2003, "Thermal Analysis of $CO_2$ Laser Processing of Fused Silica Glass," Proceedings 6th ASME-JSME Thermal Engineering Joint Conference, paper No. TED-AJ03-212.) has shown that the volume of the material that has been subjected to temperatures above the glass transition temperature is eroded under HF buffer solution at a rate twice as fast compared to the intact material. Analogous, preferential etching rates have been observed in the femtosecond laser treatment of silica glass (Taylor, R. S., Hnatovsky, C., Simova, E., Rayner, D. M., Bhardwaj, V. R., Corkum, P. B., 2003, "Femtosecond Laser Fabrication of Nanostructures in Silica Glass," Optics Letters, Vol. 28, pp. 1043-1045; Marcinkevicius, A., Juodkazis, S., Watanabe, M., Miwa, M., Matsuo, S., Misawa, H., Nishii, J., 2001, "Femtosecond Laser-Assisted Three-Dimensional Microfabrication in Silica," Optics Letters, Vol. 26, pp. 277-279.). In addition to the direct ablation of glass, a complementary process is therefore available for nanofeature fabrication in glass. The glass is coated by a thin metal layer that absorbs the energy from a NSOM probe array. The induced temperature induces a photon/heat-affected zone of the order of tens of nanometers that ultimately defines the nanofeature depth following the chemical etching. Experiments by femtosecond laser irradiation are conducted, in order to compare with nanosecond laser pulses.

3. Ablative Material Removal

As the laser fluence increases, material is removed. The material removal rate is first very small (desorption regime), but as the temperature is raised it rapidly accelerates. Spinodal decomposition occurs in the vicinity of the thermodynamic critical point. The situation is certainly complicated by the plasma formation above the surface as well as by hydrodynamic instabilities acting on the melt surface. While experimental studies and numerical simulations have predicted the ejection of molten droplets, far less is known for the material ablation in nanoscale processes. The ablative material removal is performed different ambient background pressures and in the presence of inert gases in order to test the potential contribution of the recoil pressure on the shape, dimensions and surface quality of the produced crater features.

4. Processing of Polymers

Processing of different polymers (PI, PMMA, PET, Teflon, etc.) is done using the microprobe array at different wavelengths. The response of the material is determined by complex photothermal and/or photochemical processes. Precise, digital processing is accomplished (e.g. Zhang, X., Grigoropoulos, C. P., Krajnovich, D. J., and Tam, A. C., 1996, "Excimer Laser Projection Micromachining of Polyimide Thin Films Annealed at Different Temperatures," IEEE Transactions on Components, Packaging, and Manufacturing Technology, Part C (Manufacturing), Vol. 19, p.p. 201-213). An embodiment using longer wavelengths and shorter pulses is the utilization of multi-photon effects as the linear absorption is weak to drive a phase transformation by itself. Considering that multi-photon effects are strong functions of the laser intensity, the machined feature dimensions will be much smaller. (see FIG. 12 for fs laser processing of PMMA films).

5. Ablation Nanolithography

An interesting application of the above outlined studies (Sections 3 & 4 above) is the utilization of controlled nanoablation of a masking material, followed by chemical etching procedure to define nanofeatures. Experiments are conducted by using different masking materials (a-Si, polymers) to fabricate nanoholes and nanochannels in glass and silicon wafers having 1:1 aspect ratios (depth vs. width), with the characteristic dimension in the sub-100 nm range. This exceeds by far the micron-order resolution achieved in ablation lithography (Lippert et al., 2000 Lippert, T., Wei, J., Wokaun, A., Hoogen, N., Nuyken, O., 2000, "Development and Structuring of Combined Positive-negative/negative-positive Resists using Laser Ablation as Positive Dry Etching Technique," Macromolecule Materials Engineering, Vol. 283, pp. 140-143.).

6. NSOM Nanolithography

Confined light by NSOM probe array is employed for photo-polymerization of photosensitive polymers, followed by development and selective etching process. As explained above in Section 3, the feature size can be further reduced by multi-photon absorption process by properly choosing polymer films and wavelengths of the light. Lee et al. "Fabricating High-aspect Ratio Sub-diffraction-limit Structures on Silicon with Two-photon Photopolymerization and Reactive Ion Etching," Applied Physics A, Online publication, (2004) fabricated sub-micrometer positive objects using two-photon photo-polymerization of photoresist SU-8 which was induced by femtosecond laser pulses focused by a high magnification objective lens. A similar, but nanoscale experiment was done by Zhang et al. (2002) supra, using an apertureless optical probe. Therefore, experiments are performed by using different photoresists in order to transfer negative and positive features on glass and silicon wafers. Negative features fabricated by this technique are compared with features obtained by the ablation lithography technique (see Section 5 above). A systematic study is performed to correlate the dimensions and wall quality of the produced features with the laser parameters (pulse energy, number of pulses).

7. Laser-Assisted Chemical Etching

Experiments were conducted for the chemical etching of semiconductors in $Cl_2$ atmosphere. As discussed by Bäuerle et al., "Perspectives of Laser Processing and Chemistry," Applied Phsyics A, Vol. 77, pp. 203-207 (2003), focused laser radiation can produce etching based on a photophysical process that requires Cl radicals. Well-defined features with fine wall quality, high-aspect ratio and absence of elevated rims are produced by coupling ultraviolet and visible laser radiation through the microprobe array.

III. Arbitrary Mask Photolithography

Figure 14:
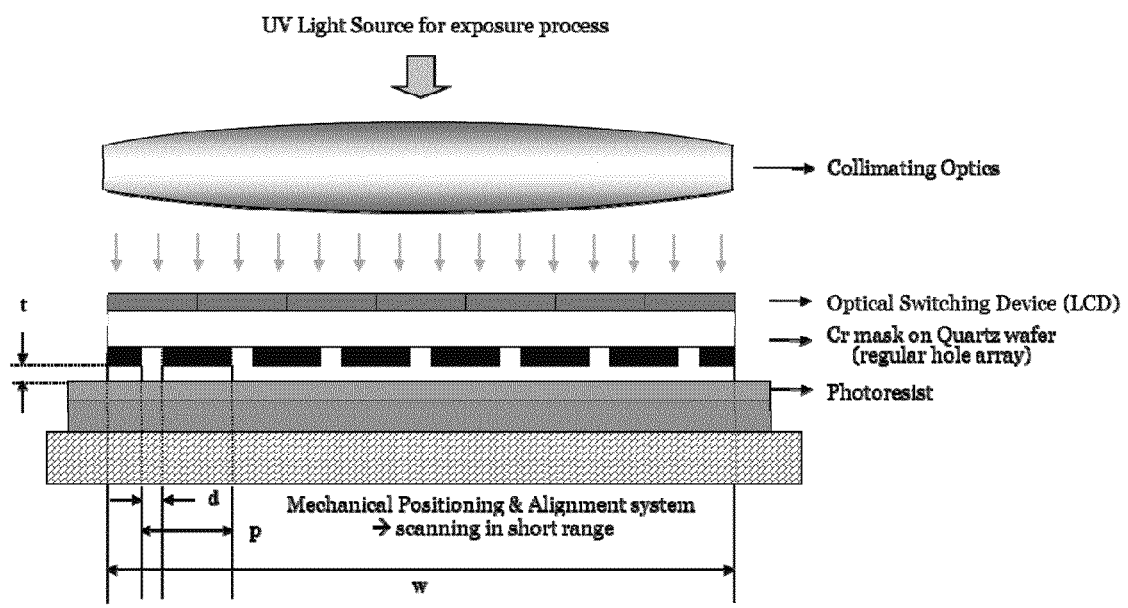
FIG. 14: Schematic of an arbitrary mask photolithography system, according to embodiments of the present disclosure.

A schematic of a system for arbitrary mask photolithography is shown in FIG. 14. Irradiation first passes through a collimating lens to produce collimated irradiation. The collimated irradiation the passes through an optical switching device (e.g., LCD). As described above, the optical switching device includes regions that are individually controllable to either transmit or block the irradiation. Below the optical switching device is a photolithography mask. In some instances, the photolithography mask includes a opaque layer and a transmissive layer. For example, the photolithography mask may include a layer of a metal (e.g., chromium) on a glass or quartz wafer. The photolithography mask may include one or more void regions that do not have a metal layer. As such, the irradiation is allowed to pass through the mask in those void regions. Below the photolithography mask is a photoresist layer. The photoresist layer may be a positive photoresist, where regions exposed to the irradiation are removed and regions not exposed to irradiation remain, or the photoresist layer may be a negative photoresist, where regions exposed to irradiation are retained and regions not exposed to irradiation are removed upon developing the photoresist.

Figure 16:
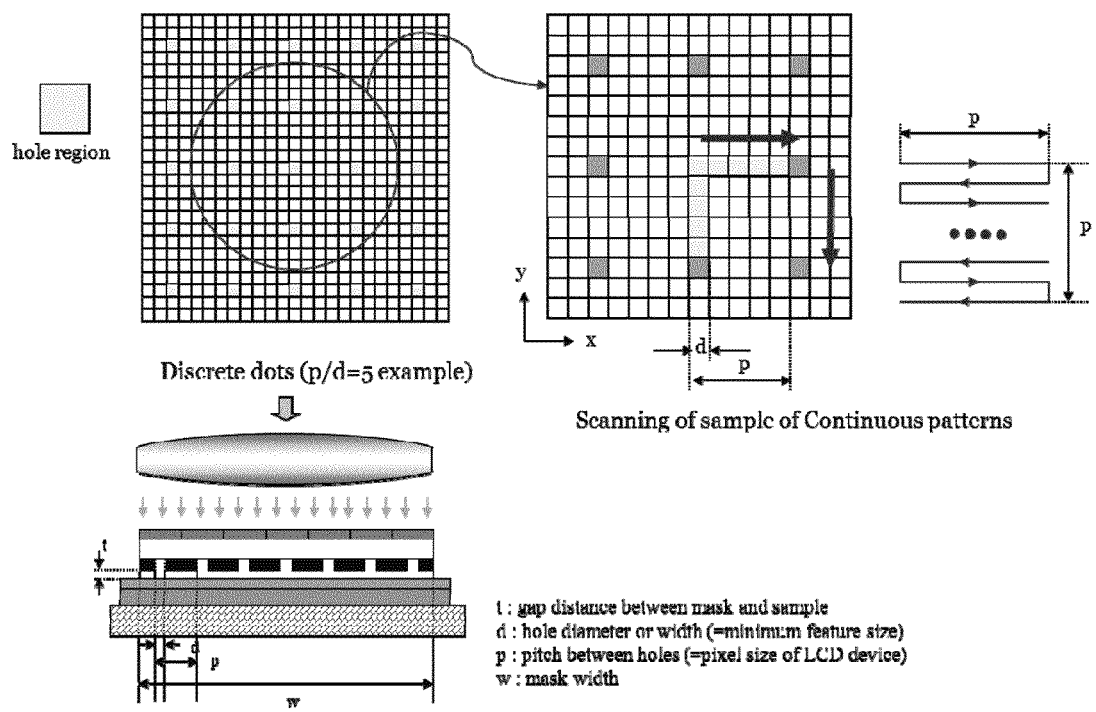
FIG. 16: Schematic of a scanning pattern for the arbitrary mask photolithography system, according to embodiments of the present disclosure.
Figure 17:
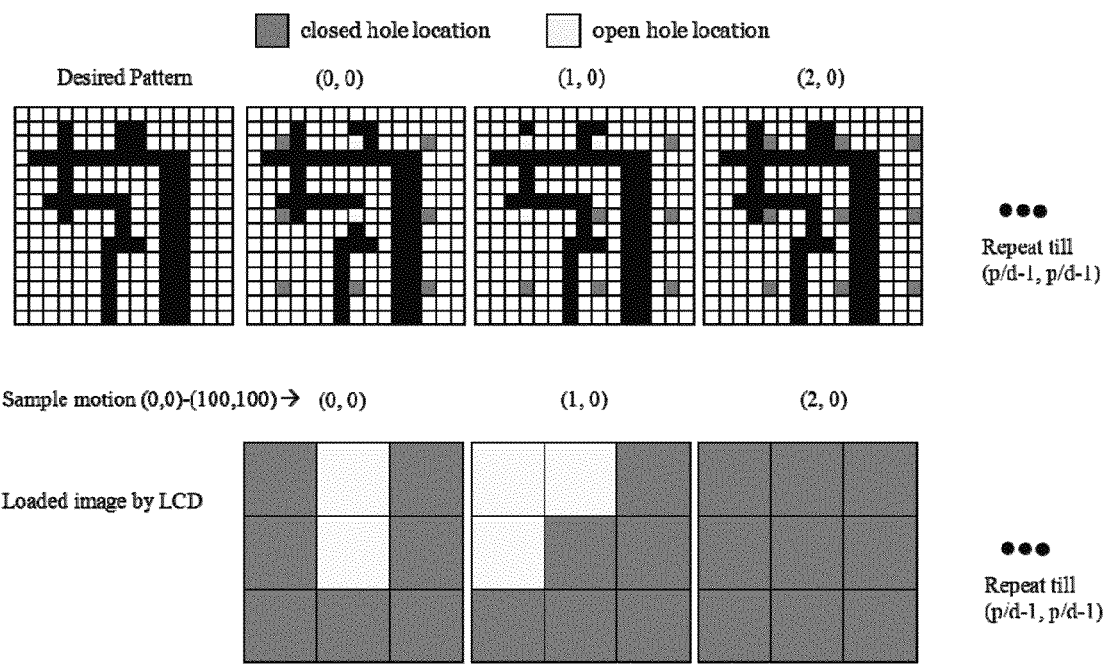
FIG. 17: Schematic of a sequential exposure scanning pattern for the arbitrary mask photolithography system, according to embodiments of the present disclosure.

A processing sequence for the arbitrary mask photolithography is shown in FIG. 15. In step 1, the sample is prepared as in FIG. 14. The optical switching device (e.g., LCD) is in a "closed" position, such that irradiation is blocked from passing through the LCD. In step 2, an arbitrary pattern is loaded on the LCD. By arbitrary is meant that any desirable pattern of open and closed regions may be loaded on the LCD. The LCD may include an array of individually controllable regions. For example, the LCD may have a grid of 10×10 regions, or 20×20 regions, or 30×30 regions, etc. In step 3, the sample is exposed to irradiation. The irradiation will be transmitted through the "open" regions of the LCD and blocked by the "closed" regions of the LCD. In step 4, the photoresist is developed to produce the patterned photoresist. The sample may be linearly translated in the x and/or y directions to produce more complex patterns, as shown in FIG. 16. In addition, more complex patterns may be produced by sequential exposure of the sample to irradiation, where each exposure includes a different pattern of open and closed regions on the LCD, as shown in FIG. 17.

An example of a scanning method is shown below.

Assuming a rectangular hole shape, let LCD pixel size=hole pitch=p, Resolution=hole diameter=d, and Exposure time for fixed mask=tp.

```
                    Scanning Protocol
% Choose normally closed type LCD
x = y = 0; % start from (0,0)
% 2d scanning
for y = 0:(p/d−1)
    % set x scanning direction in alternative way
    if y%2 = 0, mx = +d;
    else, mx = −d;
    for x = 0:(p/d−1)
        % load pattern image from data sets from CAD
        load_image(LCD_image,x,y);
        % move sample by d in x-direction
        move_sample(mx,0);
        % expose for tp period
        display_LCD(LCD_image) ;
    end
        % move sample by d in y-direction
        move_sample(0,d);
end
```

Total processing time=$(tp+\text{elapsed time})*(p/d)^2$
 (elapsed time=image loading time+sample translation time+extra delay times)

Example: 1 µm resolution system, assume LCD pixel size=p=5 µm and tp=2 sec.

Thus, total processing time=$(2+\text{elapsed time})*5^2$. If elapsed time<<tp, then exposure time ~50 sec.

Individual LCD pixels will allow irradiation to pass through p*p area.

Thus, a single scanning process of (p/d)*(p/d) will cover the whole sample area.

In certain embodiments, a scanning resolution of 1-2 µm was achieved.

The preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

All publications and patent applications cited in this specification are herein incorporated by reference as if each individual publication or patent application were specifically and individually indicated to be incorporated by reference. The citation of any publication is for its disclosure prior to the That which is claimed is:

1. A method of producing a nanostructure in a target film, the method comprising:
selectively irradiating at least one focusing element of a near-field focusing array that is in near-field focusing relationship with a target film to produce a nanostructure from the target film,
determining the distance between the near-field focusing array and the target film by measuring the capacitance between an electrode on a surface of the near-field focusing array and an electrically conductive layer on a substrate carrying the target film,
wherein the at least one focusing element of the near-field focusing array is selectively irradiated by irradiating a digital micromirror device.

2. The method according to claim 1, wherein the near-field focusing array and target film are in parallel planar relationship to each other and separated by a gas-filled gap.

3. The method according to claim 2, wherein the near-field focusing array is selected from the group consisting of a microlens array, a microaperture array and a microprojection array.

4. The method according to claim 3, wherein the near-field focusing array is a microlens array.

5. The method according to claim 4, wherein the microlens array comprises a microsphere array.

6. The method according to claim 1, wherein the target film is a nanoparticle thin film.

7. The method according to claim 1, wherein the target film comprises a photopolymerizable resin.

8. The method according to claim 1, wherein the near-field focusing array is selectively irradiated to sinter a portion of the target film.

9. The method according to claim 1, wherein the near-field focusing array is selectively irradiated to ablate a portion of the target film.

10. The method according to claim 1, wherein the digital micromirror device comprises an array of individually positionable micromirrors.

11. The method of claim 10, wherein each micromirror of the digital micromirror device corresponds to a focusing element of the near-field focusing array.

12. A method of producing a nanostructure, the method comprising:
selectively illuminating a microsphere array that is in near-field focusing relationship with a nanoparticle thin film to produce a nanostructure from the nanoparticle thin film; and
determining the distance between the microsphere array and the nanoparticle thin film by measuring the capacitance between an electrode on a surface of the microsphere array and an electrically conductive layer on a support carrying the nanoparticle thin film.

13. The method according to claim 12, wherein the microsphere array and nanoparticle thin film are in parallel planar relationship to each other and separated by a gas-filled gap.

14. The method according to claim 13, wherein the gas-filled gap has a width ranging from 50 to 1000 nm.

15. The method according to claim 12, wherein the nanoparticle thin film comprises nanoparticles ranging in size from 1 to 10 nm.

16. The method according to claim 15, wherein the nanoparticle thin film has a thickness ranging from 50 to 500 nm.

17. The method according to claim 16, wherein the nanoparticle thin film is a fluid cast nanoparticle thin film.

18. The method according to claim 17, wherein the method comprises:
depositing a fluid medium comprising nanoparticles onto a surface of the support; and
separating the fluid from the particles to produce the nanoparticle thin film.

19. The method according to claim 12, wherein the microsphere array is selectively illuminated by illuminating a digital micromirror device.

20. The method according to claim 12, wherein the microsphere array is selectively illuminated by illuminating an optical switching device that is in transmissive relationship with the microsphere array.

21. The method according to claim 20, wherein the optical switching device comprises an LCD.

* * * * *